US012772831B2

(12) United States Patent
Lee et al.

(10) Patent No.: US 12,772,831 B2
(45) Date of Patent: Oct. 20, 2026

(54) SEMICONDUCTOR DEVICE HAVING CONTACT PLUGS AND SUPPORT AND ELECTRONIC SYSTEM INCLUDING THE SAME

(71) Applicant: SAMSUNG ELECTRONICS CO., LTD., Suwon-si (KR)

(72) Inventors: Ahreum Lee, Suwon-si (KR); Woosung Yang, Suwon-si (KR); Jimo Gu, Suwon-si (KR); Jaeho Kim, Suwon-si (KR); Sukkang Sung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 521 days.

(21) Appl. No.: 18/197,283

(22) Filed: May 15, 2023

(65) Prior Publication Data

US 2024/0038660 A1 Feb. 1, 2024

(30) Foreign Application Priority Data

Jul. 28, 2022 (KR) ........................ 10-2022-0094024

(51) Int. Cl.
*H10B 41/35* (2023.01)
*G11C 16/04* (2006.01)
(Continued)

(52) U.S. Cl.
CPC ....... *H10W 20/435* (2026.01); *G11C 16/0483* (2013.01); *H10B 41/10* (2023.02);
(Continued)

(58) Field of Classification Search
CPC ........ H10B 41/00; H10B 41/10; H10B 41/20; H10B 41/23; H10B 41/27; H10B 41/30;
(Continued)

(56) References Cited

U.S. PATENT DOCUMENTS 10,770,471 B2 9/2020 Shimizu et al.
10,985,112 B2 4/2021 Eom
(Continued)

FOREIGN PATENT DOCUMENTS

| | | |
|---|---|---|
| CN | 112038346 | 12/2020 |
| KR | 10-2020-0073455 A | 6/2020 |
| KR | 10-2021-0058562 A | 5/2021 |

OTHER PUBLICATIONS

First Office Action issued Mar. 12, 2026 in corresponding Korean Patent Application No. 10-2022-0094024.

*Primary Examiner* — William B Partridge
*Assistant Examiner* — Gustavo G Ramallo
(74) *Attorney, Agent, or Firm* — Morgan, Lewis & Bockius LLP

(57) ABSTRACT

A semiconductor device includes a substrate including a memory cell region and a connection region. A memory stack includes a plurality of word lines extending in the memory cell region and the connection region in a horizontal direction that is parallel with an upper surface of the substrate. The plurality of word lines overlaps with each other in a vertical direction. A support is in the connection region and positioned at a side of the memory stack. The support includes a plurality of steps. A plurality of pad parts is on a top surface of the support. A plurality of contact plugs passes through at least some of the plurality of word lines in the vertical direction. The plurality of contact plugs directly contacts the plurality of pad parts for electrical connection therewith.

20 Claims, 28 Drawing Sheets

(51) Int. Cl.

| | |
|---|---|
| ***H10B 41/10*** | (2023.01) |
| ***H10B 41/27*** | (2023.01) |
| ***H10B 41/40*** | (2023.01) |
| ***H10B 43/10*** | (2023.01) |
| ***H10B 43/27*** | (2023.01) |
| ***H10B 43/35*** | (2023.01) |
| ***H10B 43/40*** | (2023.01) |
| ***H10B 80/00*** | (2026.01) |
| ***H10W 20/41*** | (2026.01) |
| ***H10W 20/42*** | (2026.01) |
| ***H10W 90/00*** | (2026.01) |

(52) U.S. Cl.

CPC ............ *H10B 41/27* (2023.02); *H10B 41/35* (2023.02); *H10B 41/40* (2023.02); *H10B 43/10* (2023.02); *H10B 43/27* (2023.02); *H10B 43/35* (2023.02); *H10B 43/40* (2023.02); *H10B 80/00* (2023.02); *H10W 20/42* (2026.01); *H10W 90/00* (2026.01)

(58) Field of Classification Search

CPC .............. H10B 41/35; H10B 41/40–44; H10B 41/46–50; H10B 41/60; H10B 41/70; H10B 43/00; H10B 43/10; H10B 43/20; H10B 43/23; H10B 43/27; H10B 43/30; H10B 43/35; H10B 43/40; H10B 43/50; H10B 51/00; H10B 51/10; H10B 51/20; H10B 51/30; H10B 51/40; H10B 51/50; H10B 53/00; H10B 53/10; H10B 53/20; H10B 53/30; H10B 53/40; H10B 53/50

See application file for complete search history.

(56) References Cited

U.S. PATENT DOCUMENTS

| | | | | |
|---|---|---|---|---|
| 11,127,753 | B2 | 9/2021 | Yamamoto | |
| 11,158,577 | B2 | 10/2021 | Ong et al. | |
| 11,521,675 | B1 * | 12/2022 | Tei | G11C 16/26 |
| 2015/0138862 | A1 * | 5/2015 | Park | G11C 16/0466 365/51 |
| 2017/0200731 | A1 | 7/2017 | Yoshimoto et al. | |
| 2017/0271354 | A1 * | 9/2017 | Kwak | H10B 41/10 |
| 2021/0151460 | A1 * | 5/2021 | Kim | H10B 41/40 |
| 2021/0296339 | A1 | 9/2021 | Yamamoto | |
| 2021/0384219 | A1 | 12/2021 | Wang et al. | |
| 2022/0068882 | A1 * | 3/2022 | Xiao | H01L 25/0657 |
| 2023/0108322 | A1 * | 4/2023 | Lee | H10B 43/27 257/314 |

* cited by examiner

SEMICONDUCTOR DEVICE HAVING CONTACT PLUGS AND SUPPORT AND ELECTRONIC SYSTEM INCLUDING THE SAME

CROSS-REFERENCE TO RELATED APPLICATION

This application claims priority under 35 U.S.C. § 119 to Korean Patent Application No. 10-2022-0094024, filed on Jul. 28, 2022 in the Korean Intellectual Property Office, the disclosure of which is incorporated by reference in its entirety herein.

1. Technical Field

The present inventive concept relates to a semiconductor device and an electronic system including the same, and more particularly, to a semiconductor device having a vertical channel and an electronic system including the semiconductor device.

2. Discussion of Related Art

The demand for semiconductor devices capable of storing a large amount of data has increased for semiconductor devices applied to electronic systems. Accordingly, research has been conducted to increase the data storage capacity of semiconductor devices. For example, semiconductor devices including memory cells arranged in three dimensions instead of two dimensions have been suggested to increase the data storage capacity of semiconductor devices.

SUMMARY

Embodiments of the present inventive concept provide a semiconductor device having increased structural reliability and increased reliability of an electrical connection and an electronic system including the same.

According to an embodiment of the present inventive concept, a semiconductor device includes a substrate including a memory cell region and a connection region. A memory stack includes a plurality of word lines extending in the memory cell region and the connection region in a horizontal direction that is parallel with an upper surface of the substrate. The plurality of word lines overlaps with each other in a vertical direction. A support is in the connection region and positioned at a side of the memory stack. The support includes a plurality of steps. A plurality of pad parts is on a top surface of the support. A plurality of contact plugs passes through at least some of the plurality of word lines in the vertical direction. The plurality of contact plugs directly contacts the plurality of pad parts for electrical connection therewith.

According to an embodiment of the present inventive concept, a semiconductor device includes a first substrate including a memory cell region and a connection region. A peripheral circuit region is above the first substrate. A memory stack is in the memory cell region and the connection region above the peripheral circuit region. The memory stack includes a plurality of word lines extending in a horizontal direction that is parallel with an upper surface of the first substrate and overlaps with each other in a vertical direction that is orthogonal to the horizontal direction. A plurality of channel structures is in the memory cell region. The plurality of channel structures passes through the plurality of word lines in the vertical direction. A support is in the connection region and is positioned at a side of the memory stack. The support includes a plurality of steps. A plurality of pad parts is on a bottom surface of the support. A second substrate is on the memory stack. A plurality of contact plugs passes through at least some of the plurality of word lines in the vertical direction. The plurality of contact plugs directly contacts the plurality of pad parts for electrical connection therewith.

According to an embodiment of the present inventive concept, an electronic system includes a main board. A semiconductor device is on the main board. A controller is on the main board and is electrically connected to the semiconductor device. The semiconductor device includes a substrate including a memory cell region and a connection region A memory stack includes a plurality of word lines extending in the memory cell region and the connection region in a horizontal direction that is parallel with an upper surface of the substrate. The plurality of word lines overlaps with each other in a vertical direction. A peripheral circuit is on the memory stack. A support is in the connection region and positioned at a side of the memory stack. The support includes a plurality of steps. A plurality of pad parts is on a top surface of the support. A plurality of contact plugs passes through at least some of the plurality of word lines in the vertical direction. The plurality of contact plugs directly contacts the plurality of pad parts for electrical connection therewith. An input/output pad is electrically connected to the peripheral circuit.

BRIEF DESCRIPTION OF THE DRAWINGS

Embodiments of the present inventive concept will be more clearly understood from the following detailed description taken in conjunction with the accompanying drawings in which.

DETAILED DESCRIPTION OF EMBODIMENTS

Figure 1:
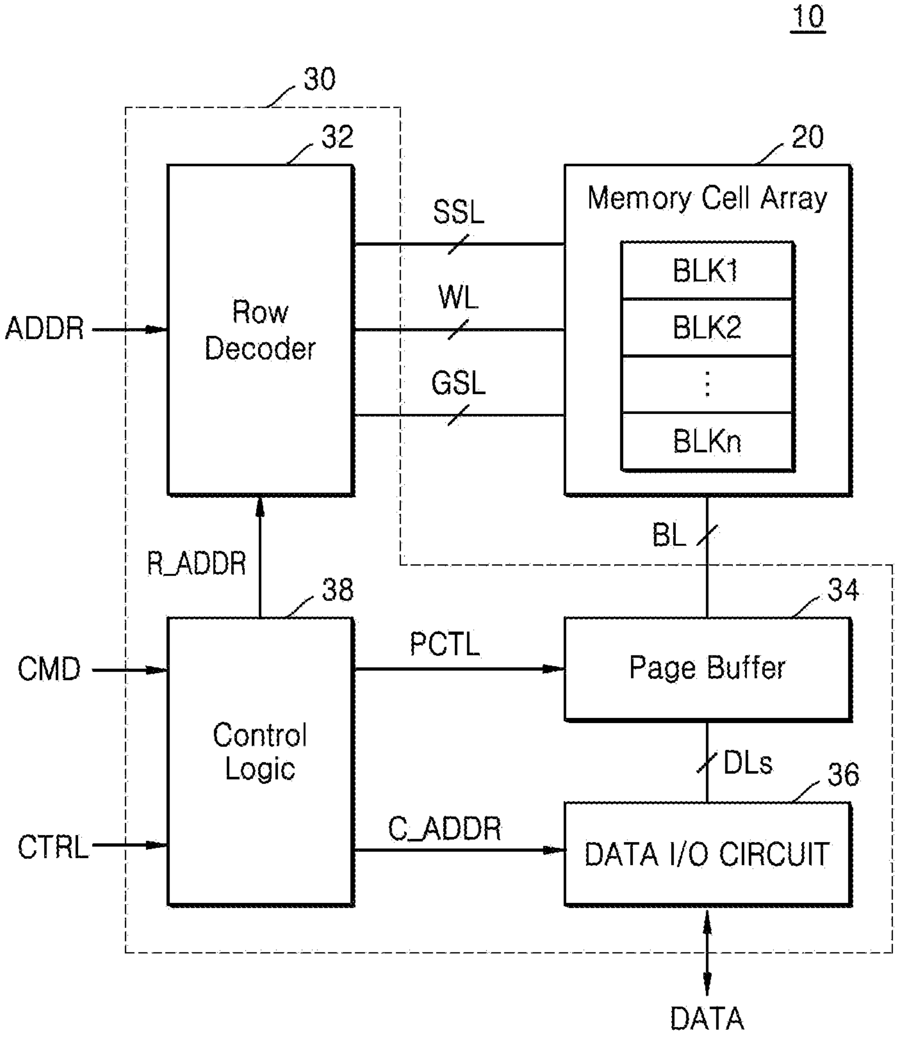
FIG. 1 is a block diagram of a semiconductor device according to an embodiment of the present inventive concept.

Hereinafter, embodiments of the present inventive concept are described in detail with reference to the accompanying drawings. Like reference numerals in the drawings denote like elements, and thus, repeated descriptions thereof may be omitted for economy of description.

FIG. 1 is a block diagram of a semiconductor device according to an embodiment.

Referring to FIG. 1, a semiconductor device 10 may include a memory cell array 20 and a peripheral circuit 30. The memory cell array 20 may include a plurality of memory blocks BLK1 to BLKn in which n is an integer greater than 2. Each of the memory blocks BLK1 to BLKn may include a plurality of memory cells The memory blocks BLK1 to BLKn may be connected to the peripheral circuit 30 through a bit line BL, a word line WL, a string select line SSL, and a ground select line GSL.

In an embodiment, the peripheral circuit 30 may include a row decoder 32, a page buffer 34, a data input/output (I/O) circuit 36, and a control logic 38. In an embodiment, the peripheral circuit 30 may further include an I/O interface, a column logic, a voltage generator, a pre-decoder, a temperature sensor, a command decoder, an address decoder, an amplifier circuit, and/or the like.

The memory cell array 20 may be connected to the page buffer 34 through the bit line BL and to the row decoder 32 through the word line WL, the string select line SSL, and the ground select line GSL. In an embodiment, the memory cells included in the memory blocks BLK1 to BLKn of the memory cell array 20 may respectively include flash memory cells. The memory cell array 20 may include a three-dimensional (3D) memory cell array. The 3D memory cell array may include a plurality of NAND strings, and each NAND string may include a plurality of memory cells respectively connected to a plurality of word lines WL vertically stacked on a substrate.

The peripheral circuit 30 may receive an address ADDR, a command CMD, and a control signal CTRL from the outside of the semiconductor device 10 and may exchange data with a device outside the semiconductor device 10.

In response to the address ADDR, the row decoder 32 may select at least one of the memory blocks BLK1 to BLKn and select the word line WL, the string select line SSL, and the ground select line GSL of the selected memory block. The row decoder 32 may transmit a voltage for performing a memory operation to the word line WL of the selected memory block.

The page buffer 34 may be connected to the memory cell array 20 through the bit line BL. In a program operation, the page buffer 34 may operate as a write driver and apply a voltage corresponding to data to be stored in the memory cell array 20 to the bit line BL. In a read operation, the page buffer 34 may operate as a sense amplifier and sense data stored in the memory cell array 20. The page buffer 34 may operate according to a control signal PCTL provided from the control logic 38.

The data I/O circuit 36 may be connected to the page buffer 34 through data lines DLs. In a program operation, the data I/O circuit 36 may receive program data from a memory controller and provide the program data to the page buffer 34 based on a column address C_ADDR provided from the control logic 38. In a read operation, the data I/O circuit 36 may provide read data stored in the page buffer 34 to the memory controller based on the column address C_ADDR provided from the control logic 38.

The data I/O circuit 36 may transmit an address or an instruction to the control logic 38 or the row decoder 32. In an embodiment, the peripheral circuit 30 may further include an electrostatic discharge (ESD) circuit and a pull-up/pull-down driver.

The control logic 38 may receive the command CMD and the control signal CTRL from the memory controller. The control logic 38 may provide a row address R_ADDR to the row decoder 32 and a column address C_ADDR to the data I/O circuit 36. The control logic 38 may generate various kinds of internal control signals, which are used in the semiconductor device 10, in response to the control signal CTRL. For example, the control logic 38 may adjust a voltage level applied to the word line WL and the bit line BL in a memory operation, such as a program operation or an erase operation.

Figure 2:
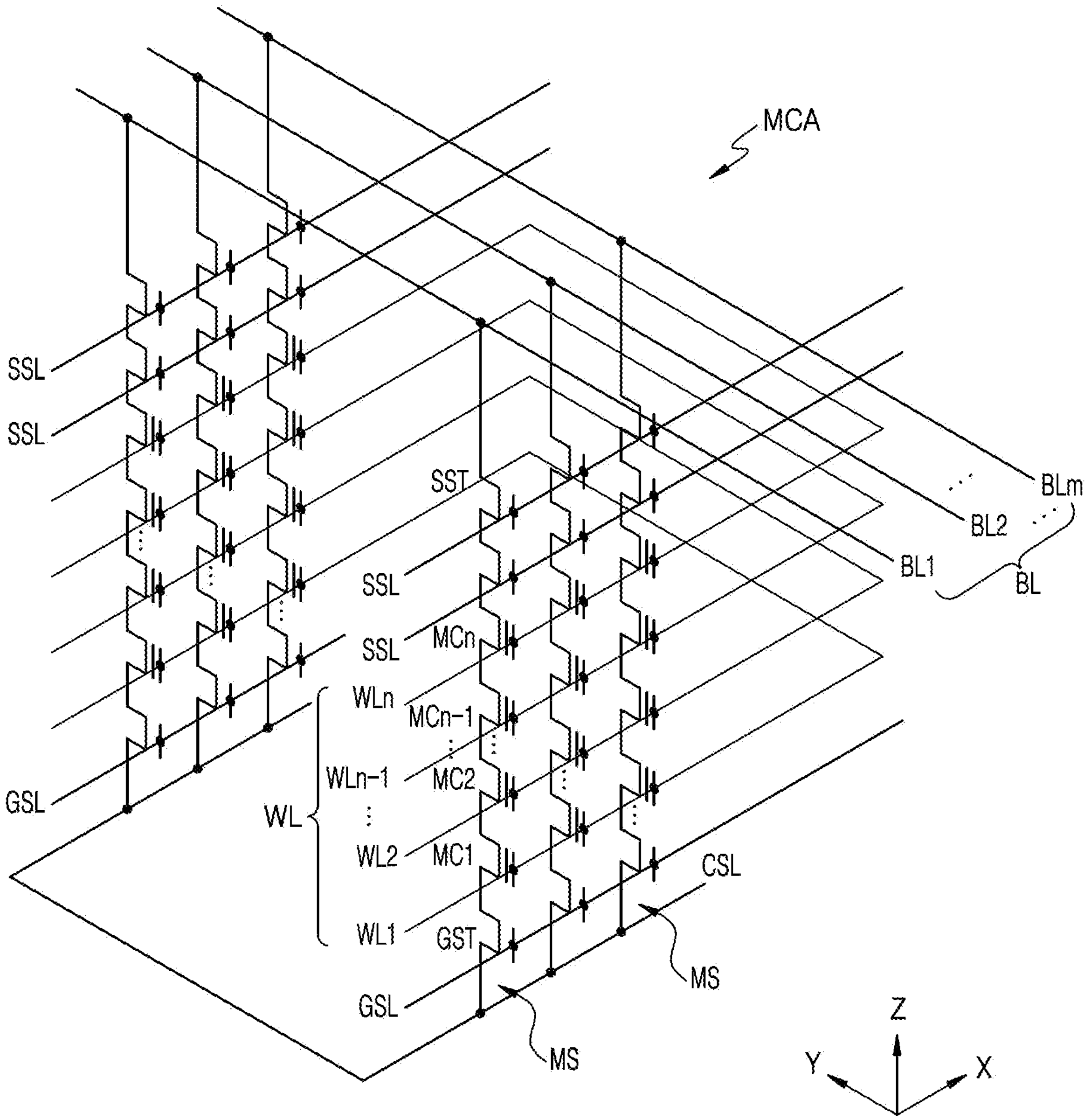
FIG. 2 is an equivalent circuit diagram of a memory cell array of a semiconductor device according to an embodiment of the present inventive concept.

FIG. 2 is an equivalent circuit diagram of a memory cell array of a semiconductor device according to an embodiment of the present inventive concept.

Referring to FIG. 2, a memory cell array MCA may include a plurality of memory cell strings MS. The memory cell array MCA may include a plurality of bit lines BL or BL1 to BLm in which m is an integer greater than 2, a plurality of word lines WL or WL1 to WLn in which n is an integer greater than 2, at least one string select line SSL, at least one ground select line GSL, a common source line CSL. The memory cell strings MS may be between the common source line CSL and the bit lines BL or BL1 to BLm. Although it is illustrated in FIG. 2 that each of the memory cell strings MS includes two string select lines SSL, embodiments of the present inventive concept are not necessarily limited thereto. For example, in an embodiment each of the memory cell strings MS may include one string select line SSL.

Each of the memory cell strings MS may include a string select transistor SST, a ground select transistor GST, and a plurality of memory cell transistors MC1 to MCn in which n is an integer greater than 2. A drain region of the string select transistor SST may be connected to a corresponding one among the bit lines BL or BL1 to BLm, and a source region of the ground select transistor GST may be connected to the common source line CSL. Respective source regions of a plurality of ground select transistors GST may be connected in common to the common source line CSL.

The string select transistor SST may be connected to a string select line SSL, and a ground select transistor GST may be connected to the ground select line GSL. The memory cell transistors MC1 to MCn may be respectively connected to the word lines WL, such as WL1 to WLn.

Figure 3:
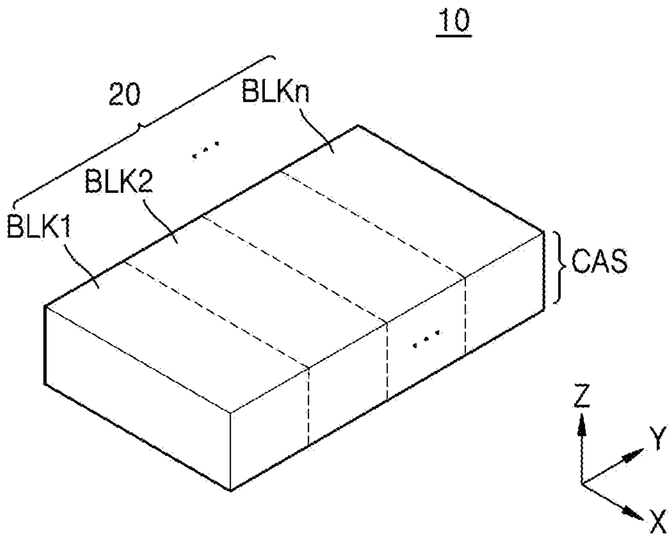
FIG. 3 is a perspective view of a semiconductor device according to an embodiment of the present inventive concept.
Figure 4A:
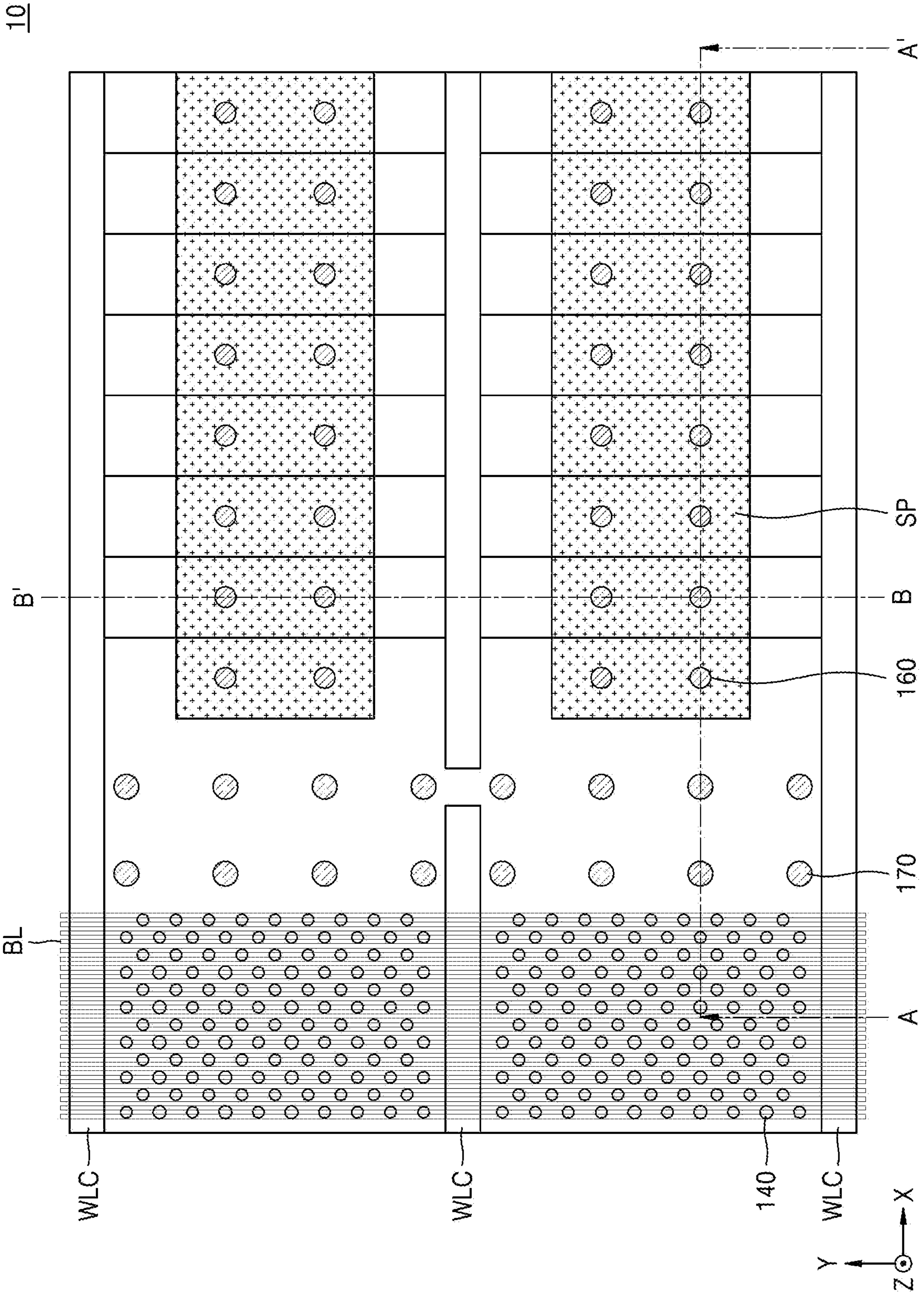
FIGS. 4A and 4B are plan views of the semiconductor device of FIG. 3 according to embodiments of the present inventive concept.
Figure 4B:
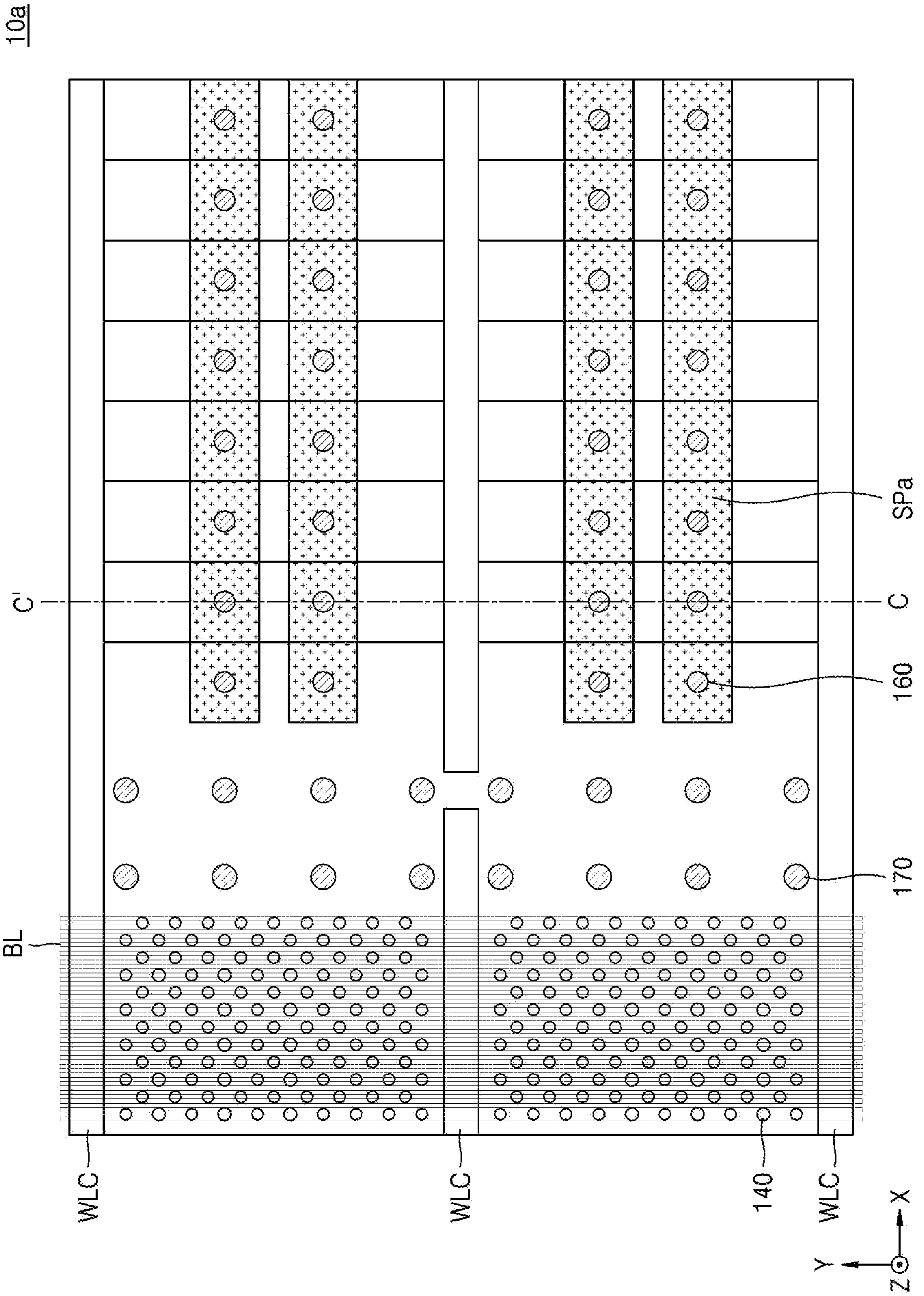
Figure 5:
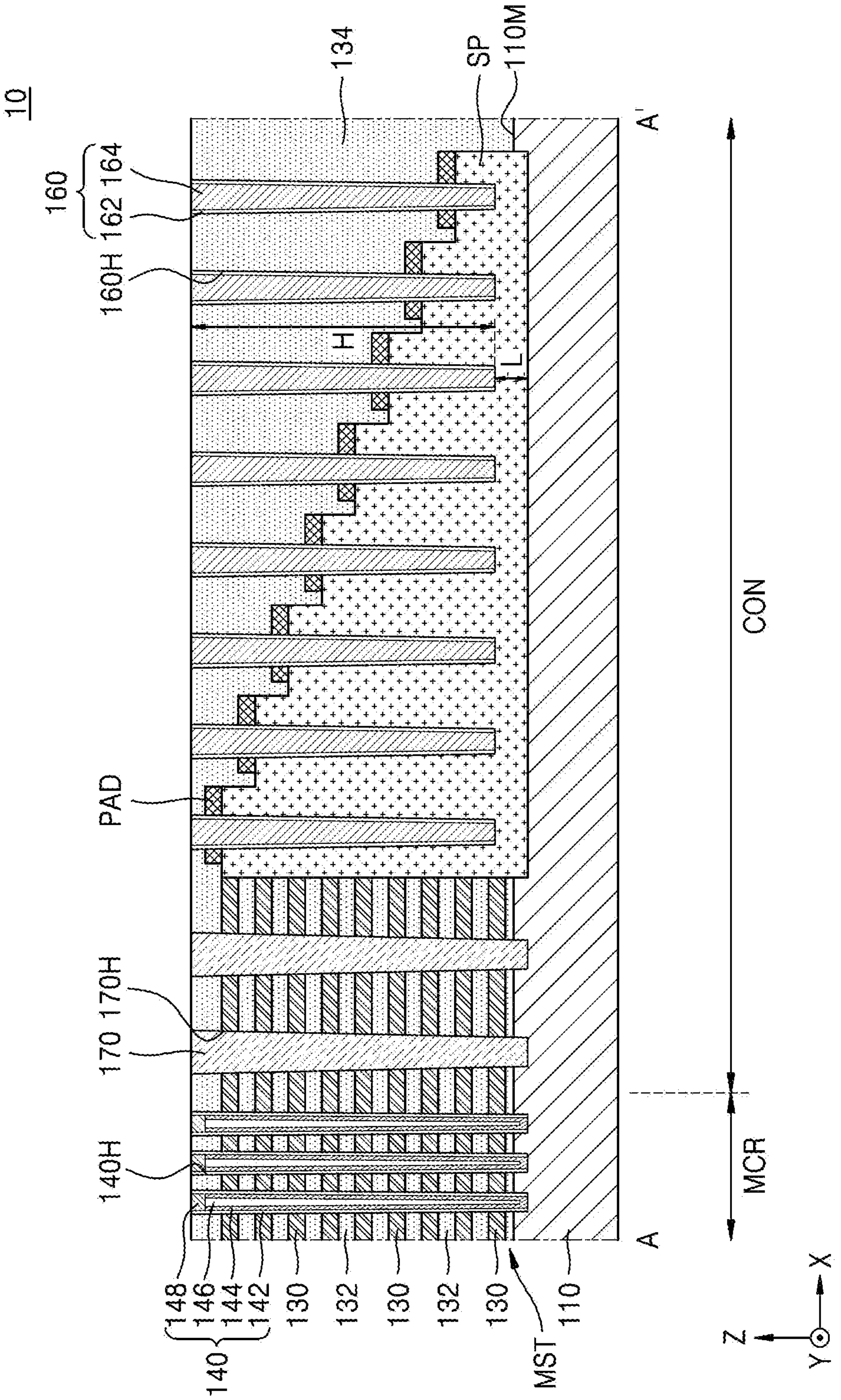
FIG. 5 is a cross-sectional view taken along line A-A' in FIG. 4A according to an embodiment of the present inventive concept.
Figure 6A:
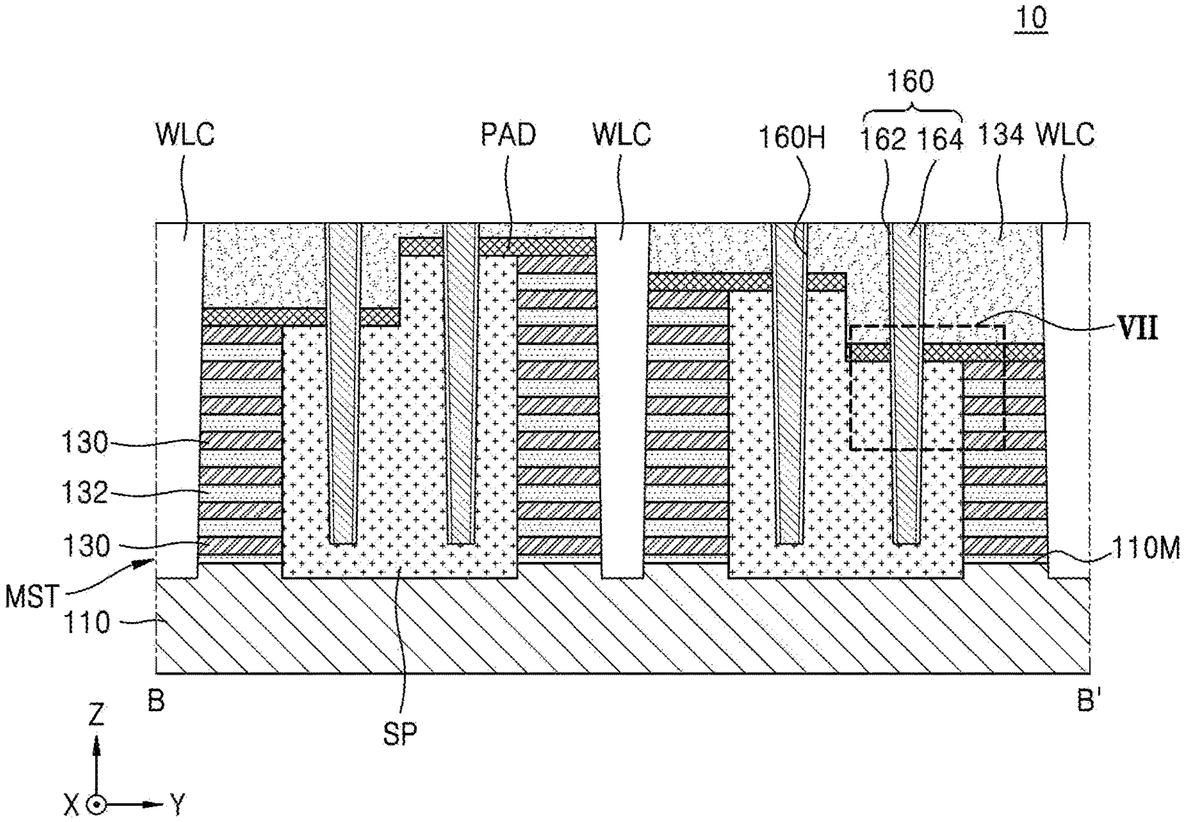
FIGS. 6A and 6B are cross-sectional views respectively taken along line B-B' in FIG. 4A and line C-C' in FIG. 4B according to embodiments of the present inventive concept.
Figure 6B:
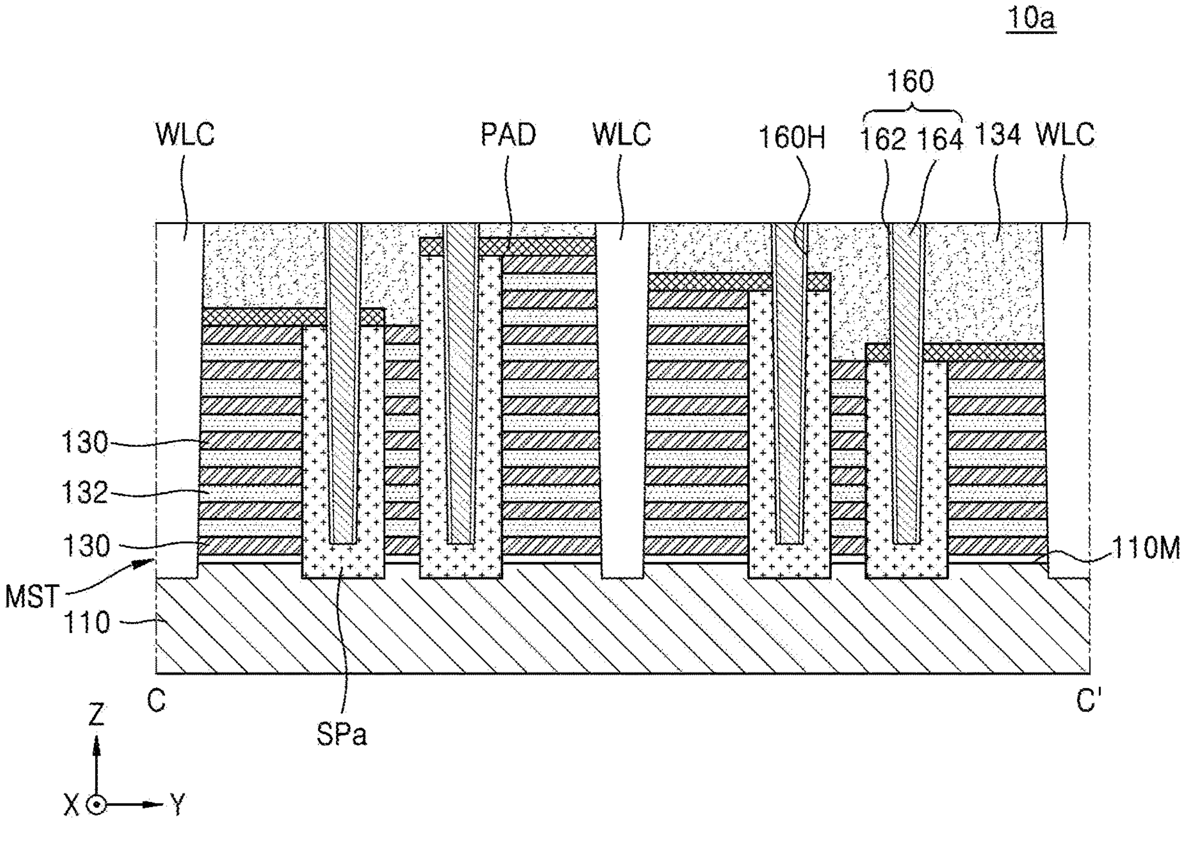

FIGS. 3 to 6B are diagrams for describing a semiconductor device according to embodiments. FIG. 3 is a perspective view of the representative configuration of a semiconductor device according to an embodiment, and FIGS. 4A and 4B are plan views of the semiconductor device of FIG. 3. FIG. 5 is a cross-sectional view taken along line A-A' in FIG. 4A. FIG. 6A is a cross-sectional view taken along line B-B' in FIG. 4A. FIG. 6B is a cross-sectional view taken along line C-C' in FIG. 4B. FIG. 5 is a cross-sectional view of a semiconductor device in a first horizontal direction (e.g., the X direction), and FIGS. 6A and 6B are cross-sectional views of the semiconductor device in a second horizontal direction (e.g., the Y direction).

Referring to FIGS. 2 to 6B, a semiconductor device 10 or 10*a* may include a cell array structure CAS. The cell array structure CAS may include the memory cell array 20 described with reference to FIG. 1.

The cell array structure CAS may include the memory blocks BLK1 to BLKn. Each of the memory blocks BLK1 to BLKn may include memory cells arranged in three dimensions.

A substrate 110 may include a memory cell region MCR and a connection region CON, which are horizontally arranged (e.g., in the X direction). In an embodiment, the substrate 110 may include a semiconductor material, such as a Group IV semiconductor, a Group III-V compound semiconductor, or a Group II-VI oxide semiconductor. For example, the Group IV semiconductor may include silicon (Si), germanium (Ge), or silicon-germanium (SiGe). The substrate 110 may be provided as a bulk wafer or an epitaxial layer. In some embodiments, the substrate 110 may include a silicon-on-insulator (SOI) substrate or a germanium-on-insulator (GeOI) substrate.

In some embodiments, the substrate 110 may include a common source region. The common source region may supply current to vertical memory cells formed in the cell array structure CAS.

A memory stack MST may be on the substrate 110 and may extend in the first horizontal direction (the X direction), which is parallel to a topmost surface 110M of the substrate 110, and the second horizontal direction (the Y direction), which is perpendicular to the first horizontal direction (the X direction) and parallel to a topmost surface 110M of the substrate 110. The memory stack MST may include a plurality of word lines 130 and a plurality of insulating layers 132. The word lines 130 and the insulating layers 132 may be alternately stacked in a vertical direction (e.g., the Z direction), which is orthogonal to the topmost surface 110M of the substrate 110.

In an embodiment, the word lines 130 may include a buried conductive layer and a conductive barrier layer, which surrounds the top, bottom, and side surfaces of the buried conductive layer. For example, in an embodiment the buried conductive layer may include metal, such as tungsten, nickel, cobalt, or tantalum; metal silicide, such as tungsten silicide, nickel silicide, cobalt silicide, or tantalum silicide; doped polysilicon; or a combination thereof. In some embodiments, the conductive barrier layer may include titanium nitride, tantalum nitride, tungsten nitride, or a combination thereof.

In some embodiments, the word lines 130 may respectively correspond to a ground select line GSL, the word lines WL, such as word lines WL1 to WLn, and at least one string select line SSL, which form a memory cell string MS. For example, a lowest word line 130 may function as the ground select line GSL, two uppermost word lines 130 may respectively function as string select lines SSL, and the remaining word lines 130 may respectively function as the word lines WL. Accordingly, the memory cell string MS, in which a ground select transistor GST, a string select transistor SST, and the memory cell transistors MC1 to MCn therebetween are connected in series to one another, may be provided. In some embodiments, at least one of the word lines 130 may function as a dummy word line. However, embodiments of the present inventive concept are not necessarily limited thereto.

In the connection region CON, a support SP may be arranged at one side (e.g., in a horizontal direction) of the memory stack MST. The support SP may have a stepped structure. For example, the top surface of the support SP may approach the topmost surface 110M of the substrate 110 in the vertical direction (the Z direction) away from the memory cell region MCR in the first horizontal direction (the X direction). For example, the vertical level of the top surface of the support SP may decrease as a distance away from the memory cell region MCR increases in the first horizontal direction (the X direction). The bottom surface of the support SP may be at a lower vertical level than the topmost surface 110M of the substrate 110. The bottom surface of the support SP may be surrounded by the substrate 110. The bottom surface of the support SP may refer to a surface of the support SP that is in direct contact with the substrate 110, and the top surface of the support SP may refer to a surface of the support SP that faces the bottom surface of the support SP and is spaced apart from the bottom surface of the support SP in the vertical direction (the Z direction). A pad part PAD may be on the top surface of the support SP. For example, the support SP may include an insulating material. For example, in an embodiment the support SP may include silicon oxide. For example, the topmost surface 110M of the substrate 110 may correspond to the main surface thereof.

Figure 10:
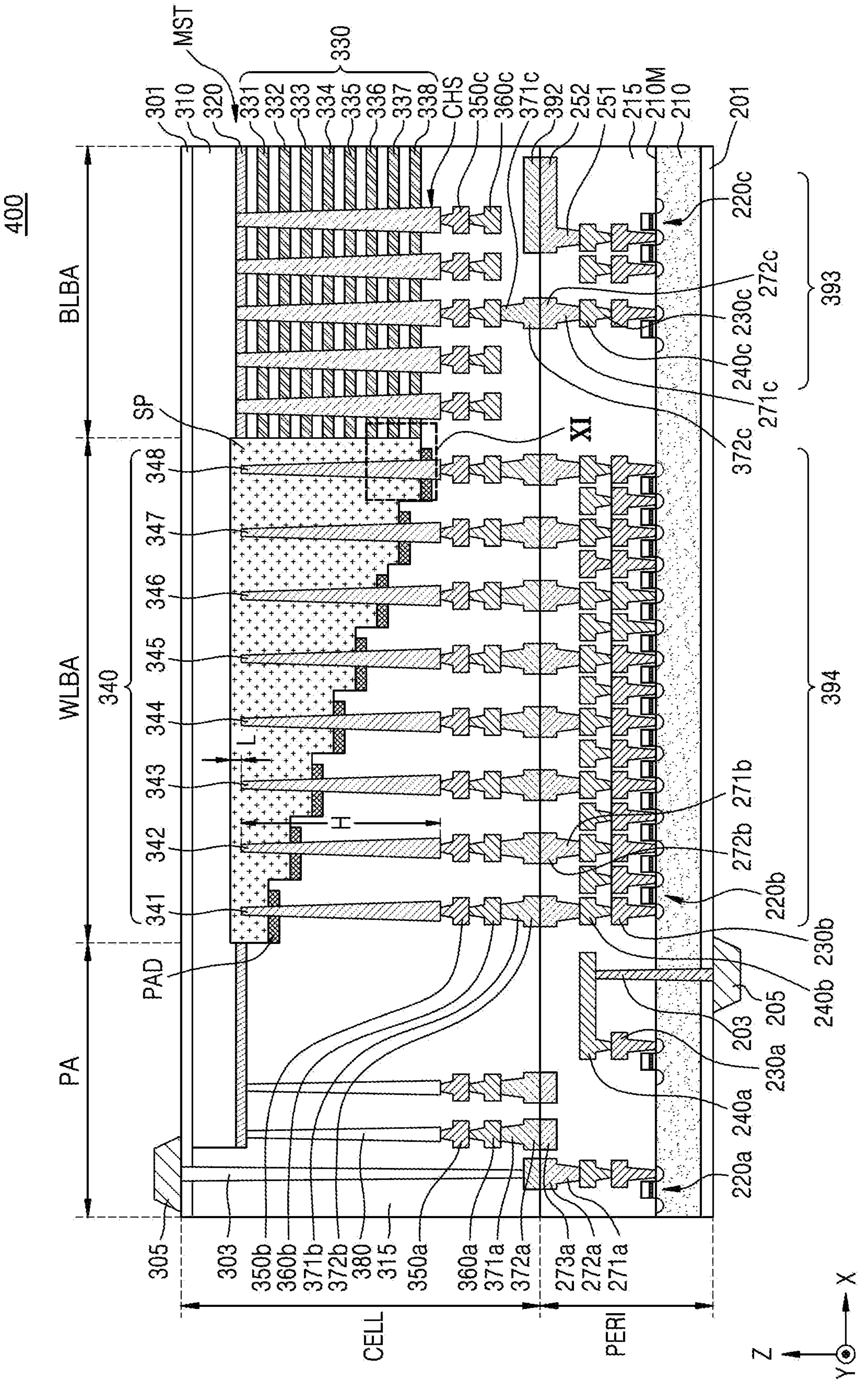
FIG. 10 is a cross-sectional view of a semiconductor device according to an embodiment of the present inventive concept.
Figure 11:
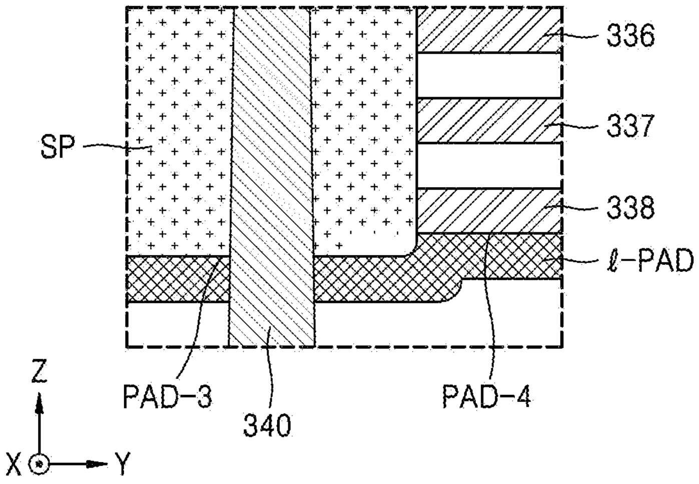
FIG. 11 is an enlarged cross-sectional view of a region XI in FIG. 10, according to an embodiment of the present inventive concept.

In the drawings except for FIGS. 10 and 11, the bottom surface of a structure may be relatively near the topmost surface 110M of the substrate 110 in the vertical direction (the Z direction), and the top surface of the structure may face the bottom surface thereof.

Referring to FIG. 4A, the support SP may surround the respective side walls of a plurality of contact plugs 160 which are arranged in both the first and second horizontal directions (the X and Y directions). The thickness of the support in the second horizontal direction (the Y direction) may be greater than the diameter of each of the plurality of contact plugs 160.

Referring to FIG. 4B, a support SPa may surround the respective side walls of at least two contact plugs 160, which are selected from the plurality of contact plugs 160, which are arranged in the first horizontal direction (the X direction). In addition, the support SPa may surround the side wall of one of the contact plugs 160 in the second horizontal direction (the Y direction) but may not extend to surround side walls of a plurality of contact plugs 160 arranged in the second horizontal direction (the Y direction). In an embodiment, the thickness of the support in the second horizontal direction (the Y direction) may be greater than the diameter of each of the plurality of contact plugs 160 and may be less than twice the diameter of each of the plurality of contact plugs.

According to an embodiment, a plurality of channel structures 140 may extend from the substrate 110 in the vertical direction (the Z direction) in the memory cell region MCR and pass through the word lines 130 and the insulating layers 132. The channel structures 140 may be spaced apart from one another by a certain distance in the first horizontal direction (the X direction), the second horizontal direction (the Y direction), and a third horizontal direction (e.g., a diagonal direction). For example, in an embodiment the channel structures 140 may be arranged in a zigzag or staggered pattern.

Each of the channel structures 140 may be disposed in a channel hole 140H in the memory cell region MCR. Each of the channel structures 140 may include a gate insulating layer 142, a channel layer 144, a buried insulating layer 146, and a conductive plug 148. The gate insulating layer 142 and the channel layer 144 may be sequentially arranged on the side wall of the channel hole 140H. For example, the gate insulating layer 142 may be conformal to the side wall of the channel hole 140H, and the channel layer 144 may be conformal to the side wall and the bottom of the channel hole 140H. The buried insulating layer 146 may be on the channel layer 144 to fill the remaining space of the channel hole 140H. The conductive plug 148 may be positioned on an upper portion of the channel hole 140H and is in direct contact with the channel layer 144. The conductive plug 148 may block the channel hole 140H. In some embodiments, the buried insulating layer 146 may be arranged on the channel layer 144 to fill a portion of the channel hole 140H, and the conductive plug 148 may be in direct contact with the channel layer 144 and the buried insulating layer 146 and fill an upper portion of the channel hole 140H. For example, the buried insulating layer 146 may fill the space defined by the channel layer 144 in the channel hole 140H. However, embodiments of the present inventive concept are not necessarily limited thereto For example, in some embodiments, the buried insulating layer 146 may be omitted, and the channel layer 144 may have a pillar shape filling the remaining portion of the channel hole 140H.

As shown in FIGS. 4A, 4B, 6A, and 6B, a plurality of word line cut regions WLC may be in the substrate 110 and extend in the first horizontal direction (the X direction) that is parallel with the topmost surface 110M of the substrate 110. A plurality of word lines 130 between two adjacent word line cut regions WLC may form a single memory block. For example, the plurality of word lines 130 between two adjacent word line cut regions WLC may form the memory blocks BLK1 to BLKn illustrated in FIG. 3.

In an embodiment, in each word line cut region WLC, a word line isolation dielectric layer may be in a word line hole. In an embodiment, the word line isolation dielectric layer may include a silicon oxide film, a silicon nitride film, SiON, SiOCN, SiCN, or a combination thereof.

As shown in FIG. 5, the bottom surface of the channel layer 144 may be at a lower vertical level than the topmost surface 110M of the substrate 110 and thus may be in direct contact with the substrate 110.

Figure 7:
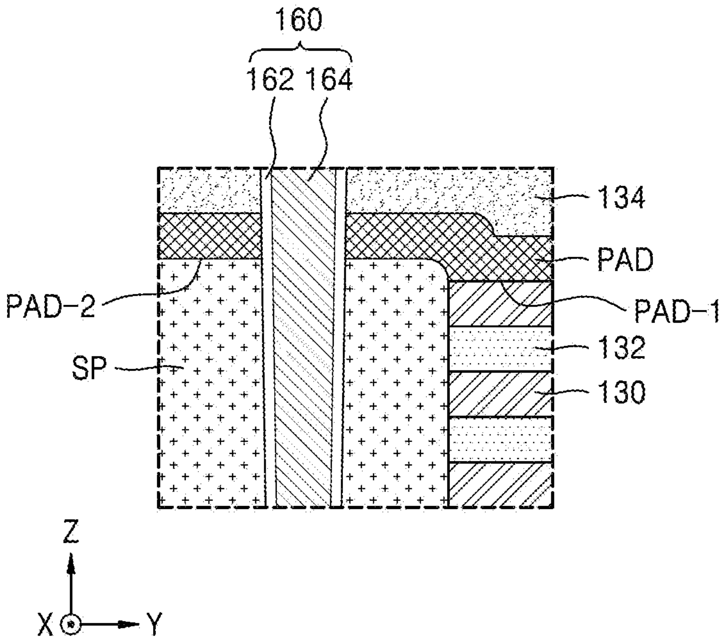
FIG. 7 is an enlarged cross-sectional view of a region VII in FIG. 6A, according to an embodiment of the present inventive concept.

In an embodiment, in the connection region CON, each of the word lines 130 may extend in the first horizontal direction (the X direction) such that each word line 130 has a shorter length in a horizontal direction (e.g., the X direction and/or the Y direction) as a distance increases from the topmost surface 110M of the substrate 110. The pad part PAD may be disposed on the top surface of the support SP having a stepped shape and may refer to each of pads, which are respectively connected to the word lines 130 electrically and/or physically. The pad part PAD may be in direct contact with each of the word lines 130. For example, each pad part PAD may be in direct contact with only one of the word lines 130. In addition, the pad part PAD may be separated from an insulating layer 132, which is on the word line 130 that is in direct contact with the pad part PAD, in the first, second, or third horizontal direction (the X, Y, or diagonal direction). A cover insulating layer 134 may be on the pad part PAD. For example, as shown in FIG. 7, the cover insulating layer 134 may be disposed on an upper surface of the pad part PAD.

The contact plugs 160 may be in the connection region CON and pass through the cover insulating layer 134, a plurality of word lines 130, and a plurality of insulating layers 132. Each of the contact plugs 160 may be in a contact hole 160H, which passes through the cover insulating layer 134, the word lines 130, and the insulating layers 132.

Each contact plug 160 may include a contact plug insulating layer 162 and a contact plug conductive layer 164. The contact plug insulating layer 162 and the contact plug conductive layer 164 may be sequentially arranged on the side wall of the contact hole 160H. For example, in an embodiment, the contact plug insulating layer 162 may be conformal to the side wall of the contact hole 160H, and the contact plug conductive layer 164 may be conformal to the side wall and the bottom of the contact hole 160H.

The contact plug 160 may be electrically connected to the pad part PAD and may be separated from at least one word line 130, which is at a lower vertical level than the pad part PAD among the word lines 130. The bottom of the contact plug 160 may be surrounded by the support SP.

The contact plug 160 may pass through the pad part PAD and may be in direct contact with the pad part PAD. The bottom surface of the contact plug 160 may be positioned at a lower vertical level than the bottom surface of the pad part PAD that is in direct contact with the contact plug 160. The bottom surface of the contact plug 160 may be at a lower vertical level than the bottom surface of the lowermost pad part PAD, which is nearest to the substrate 110 in the vertical direction (the Z direction) among a plurality of pad parts PAD. The bottom surface of the contact plug 160 may be at a higher vertical level than the bottom surface of the support SP. For example, the support SP may cover a bottom surface of the contact plug 160.

In an embodiment, the deviation percentage in heights H of contact plugs 160 may be less than about 50%. The deviation percentage in distances L from the bottom surface of the support SP to the bottom surfaces of the contact plugs 160 in the vertical direction (the Z direction) may be less than about 50%. For example, in an embodiment the deviation percentage in heights H of the contact plugs 160 may be in a range from about 30% to about 50%.

A plurality of dummy channel structures 170 may be further formed in the connection region CON. The dummy channel structures 170 extend from a top surface of the substrate 110 in the vertical direction (the Z direction) and pass through the word lines 130 and the insulating layers 132. The dummy channel structures 170 may be formed to prevent the word lines 130 from leaning or bending in the manufacturing processes of the semiconductor device 10 and securing the structural stability of the word lines 130. The dummy channel structures 170 may have similar structure and shape to the channel structures 140 and a repeated description may be omitted for economy of description.

Each of the dummy channel structures 170 may include an insulator filling a dummy channel structure hole 170H. In some embodiments, the dummy channel structures 170 may include the same material as the support SP and/or the cover insulating layer 134. In some embodiments, the dummy channel structures 170 may include a different material than the support SP and/or the cover insulating layer 134.

In semiconductor devices according to the related art, the deviation in height of a plurality of contacts is relatively high, and therefore, a process of forming the contact plugs is relatively complex.

In contrast, in a semiconductor device according to an embodiment of the present inventive concept, the support SP is arranged at a side of the word lines 130, and therefore, the deviation in heights H of the contact plugs 160 may be relative low. Accordingly, a process of forming the contact plugs 160 may be relatively easy. As a result, the semiconductor device may have an increased reliability.

FIG. 7 is an enlarged cross-sectional view of a region VII in FIG. 6A, according to an embodiment.

Referring to FIGS. 6A and 7, the bottom surface of the pad part PAD may be in direct contact with a word line 130 and the support SP. A bottom surface of the pad part PAD, which is in direct contact with the word line 130 is a first portion PAD-1. A bottom surface of the pad part PAD which is in direct contact with the support SP is a second portion PAD-2. In an embodiment, both the top and bottom surfaces of the pad part PAD may have a stepped portion. For example, the first portion PAD-1 of the pad part PAD may be closer to the topmost surface 110M of the substrate 110 than the second portion PAD-2 of the pad part PAD in the vertical direction (the Z direction). For example, the vertical level of the first portion PAD-1 of the pad part PAD may be lower than that of the second portion PAD-2 of the pad part PAD. The top surface of the first portion PAD-1 of the pad part PAD may be lower than the top surface of the second portion PAD-2 of the pad part PAD. The bottom surface of the first portion PAD-1 of the pad part PAD may be lower than the bottom surface of the second portion PAD-2 of the pad part PAD.

The top surface of the support SP directly contacting the bottom surface of the pad part PAD may be positioned at a higher vertical level than the top surface of the word line 130 directly contacting the bottom surface of the pad part PAD. In an embodiment in which the top surface of the support SP directly contacting the bottom surface of the pad part PAD is at a higher vertical level than the top surface of the word line 130 directly contacting the bottom surface of the pad part PAD, the structure may permit the pad part PAD to be in direct contact with only one word line 130, thereby increasing the electrical reliability of the semiconductor device 10.

FIGS. 8A to 9G are cross-sectional views of sequential stages in a method of manufacturing a semiconductor device, according to embodiments. A method of manufacturing the semiconductor device 10 illustrated in FIGS. 4A, 5, and 6A is described as an example. FIGS. 8A to 8G are cross-sectional views taken in the first horizontal direction (the X direction), and FIGS. 9A to 9G are cross-sectional views taken in the second horizontal direction (the Y direction).

Figure 8A:
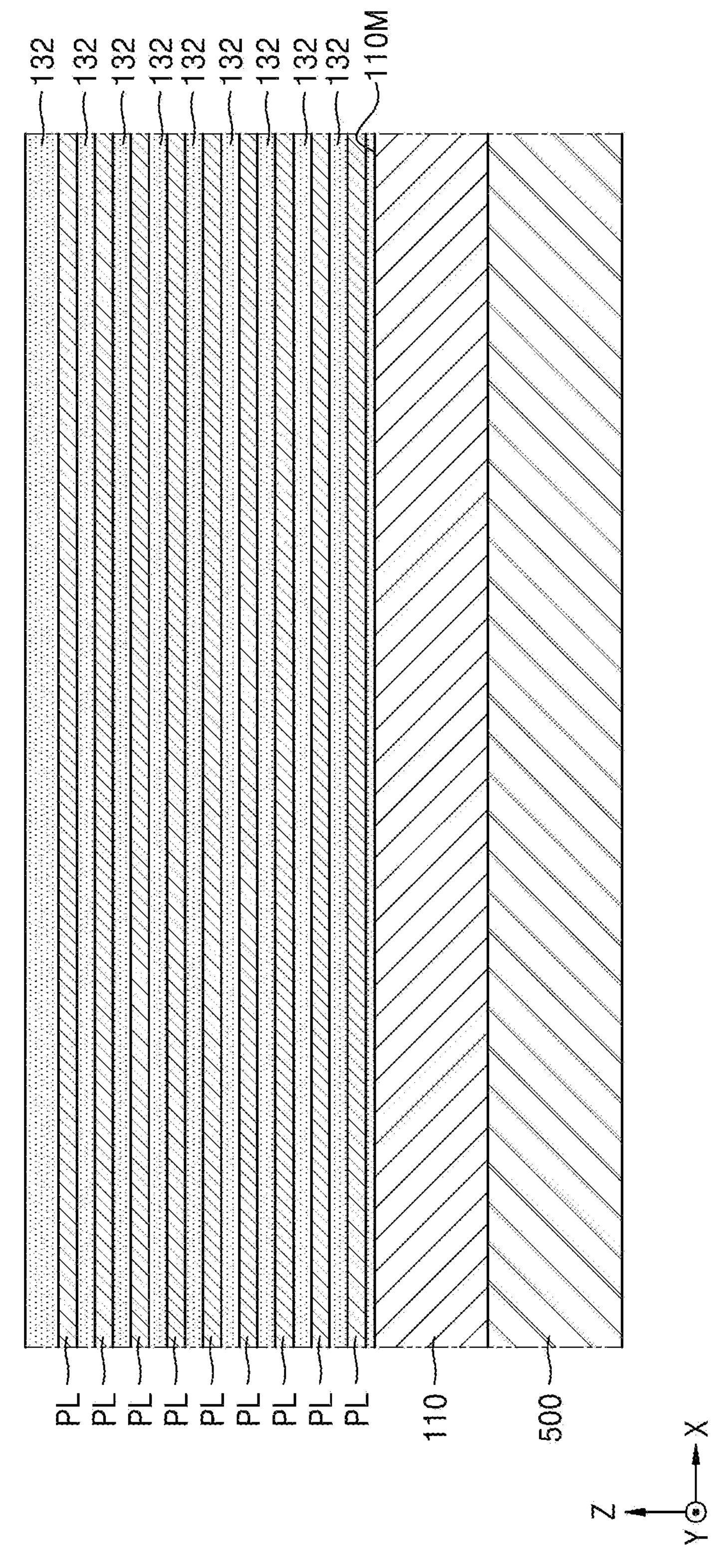
FIGS. 8A to 9G are cross-sectional views of sequential stages in a method of manufacturing a semiconductor device, according to embodiments of the present inventive concept.
Figure 9A:
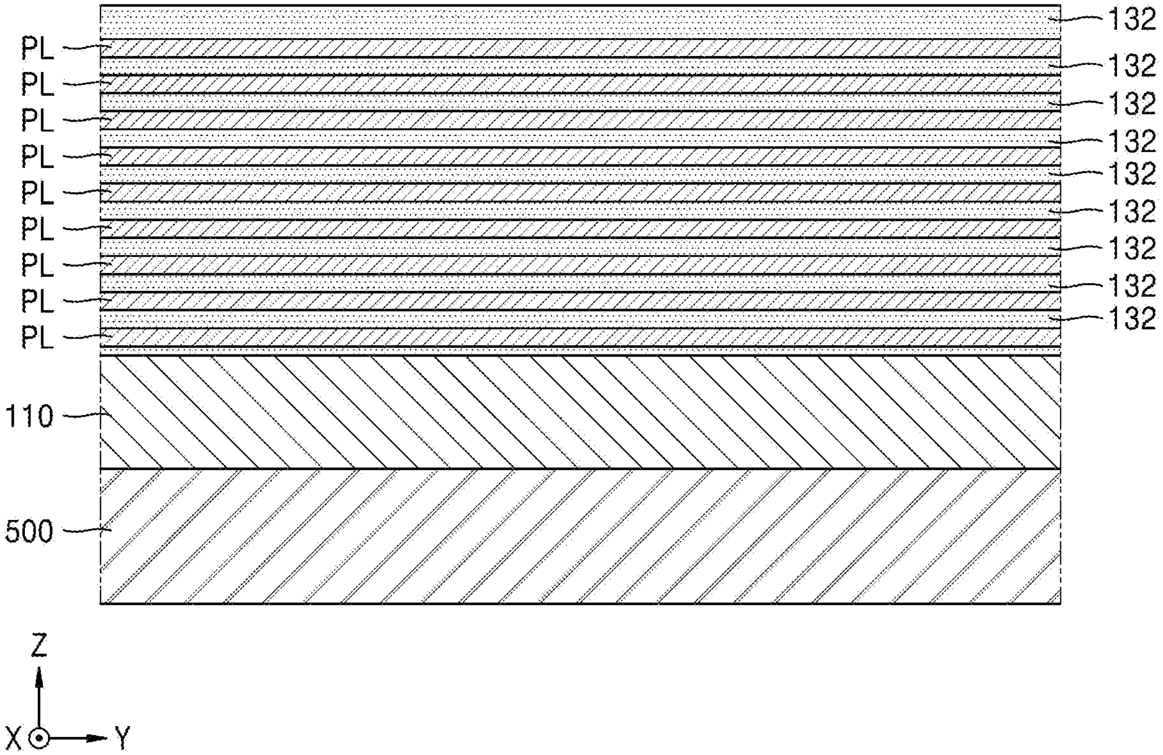

Referring to FIGS. 5, 8A, and 9A, a plurality of insulating layers 132 and a plurality of sacrificial films PL may be alternately stacked (e.g., in the Z direction) on the substrate 110 in the memory cell region MRC and the connection region CON. In an embodiment, the sacrificial films PL may include silicon nitride, silicon carbide, or polysilicon. Each of the sacrificial films PL may secure a space for a word line 130 formed in a subsequent process.

Figure 8B:
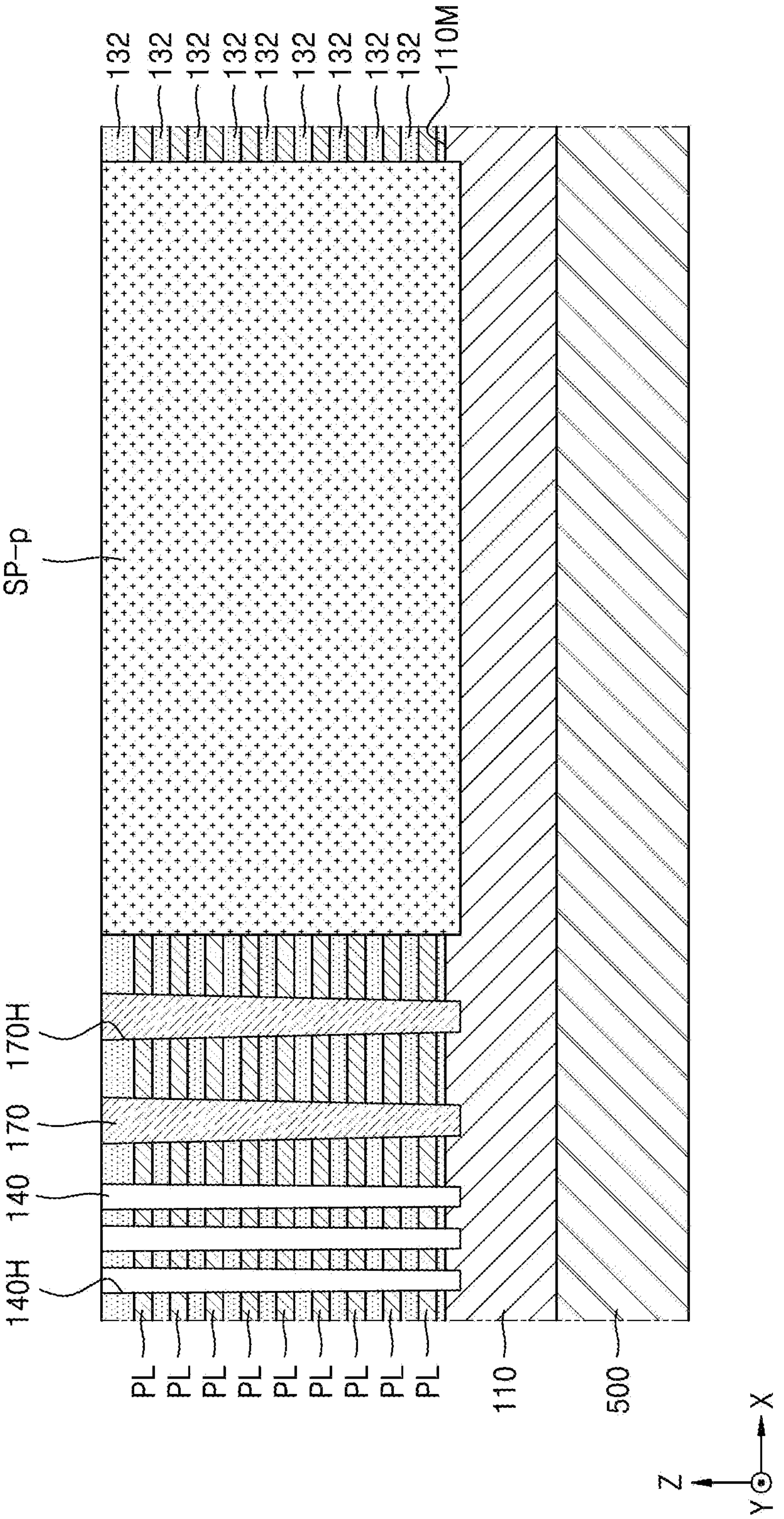
Figure 9B:
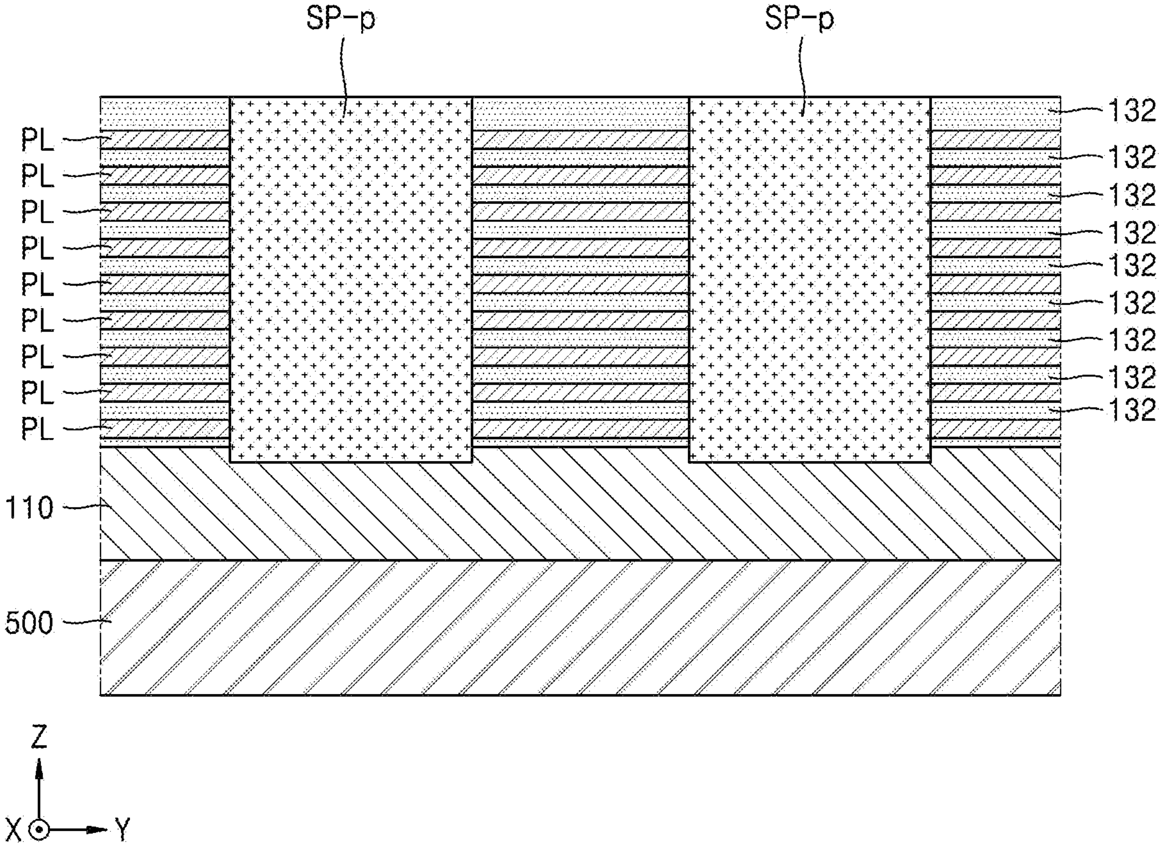

Referring to FIGS. 5, 8B, and 9B, a preliminary support SP-p may be formed on the substrate 110 in the connection region CON. The preliminary support SP-p may be arranged at one side of the insulating layers 132 and the sacrificial films PL (e.g., in a horizontal direction). For example, in an embodiment the preliminary support SP-p may include an insulating material (e.g., an oxide). For example, the preliminary support SP-p may include silicon oxide. The preliminary support SP-p may include a different material than the sacrificial films PL.

Figure 8C:
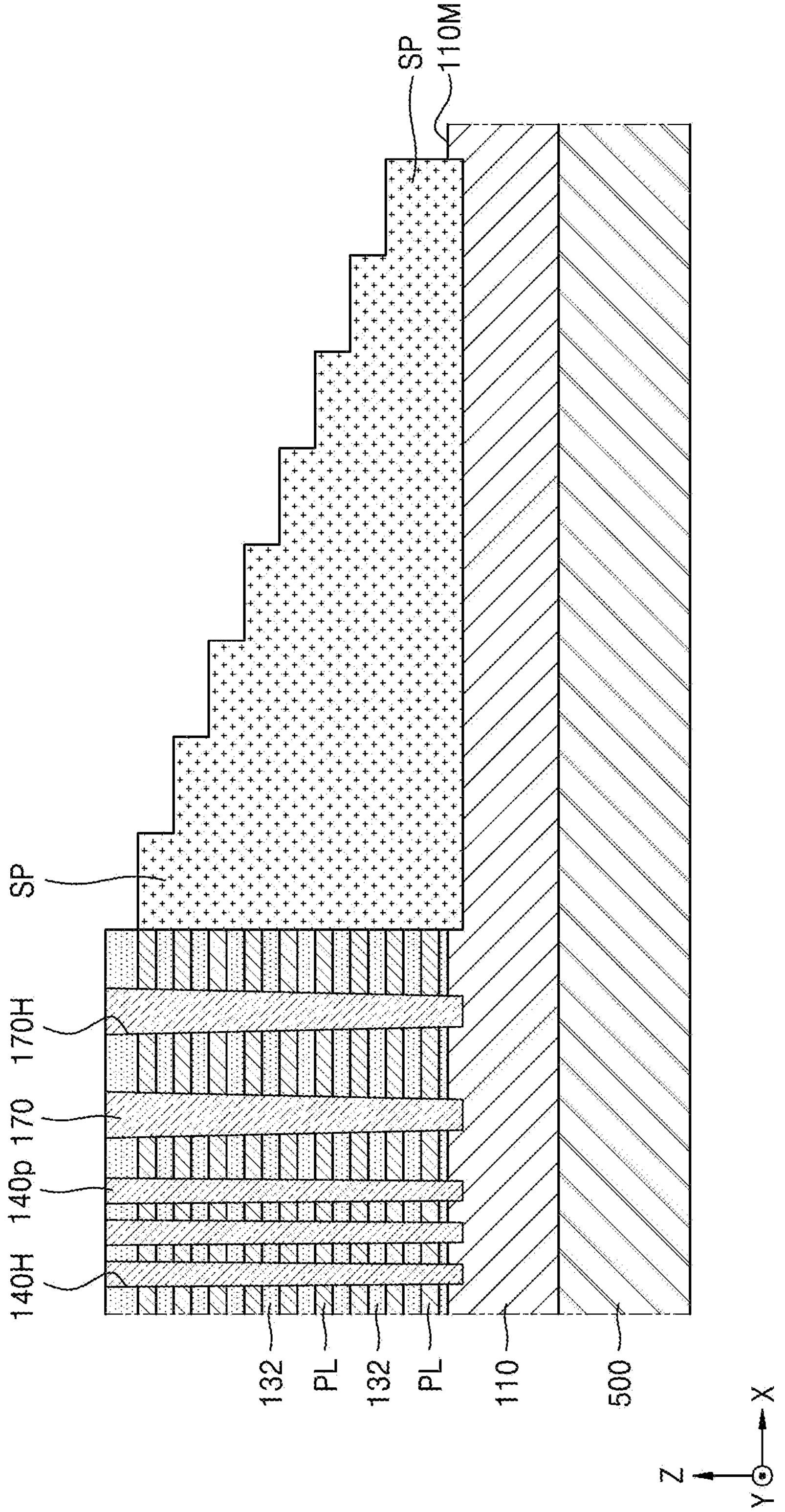

A plurality of channel holes 140H, which extend in the vertical direction (the Z direction) and pass through the insulating layers 132 and the sacrificial films PL, may be formed in the memory cell region MRC. As shown in FIG. 8C, a preliminary channel insulating film 140*p* may be formed in each of the channel holes 140H. The preliminary channel insulating film 140*p* may include an insulating material. For example, in an embodiment the preliminary channel insulating film 140*p* may include the same material as the support SP and/or the insulating layers 132. Alternatively, the preliminary channel insulating film 140*p* may include a different material from the support SP and the insulating layers 132.

Figure 9C:
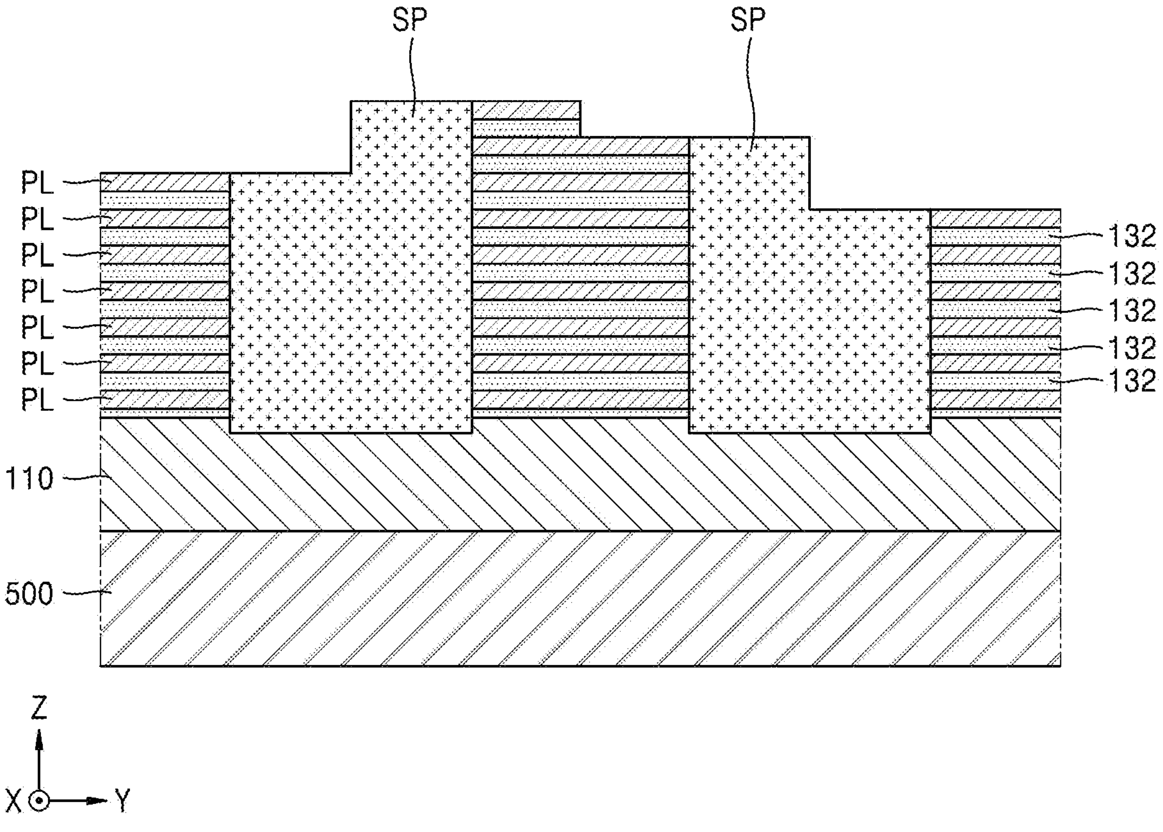

Referring to FIGS. 5, 8C, and 9C, the insulating layers 132, the sacrificial films PL, and the preliminary support SP-p may be partially removed to have a stepped structure.

Figure 8D:
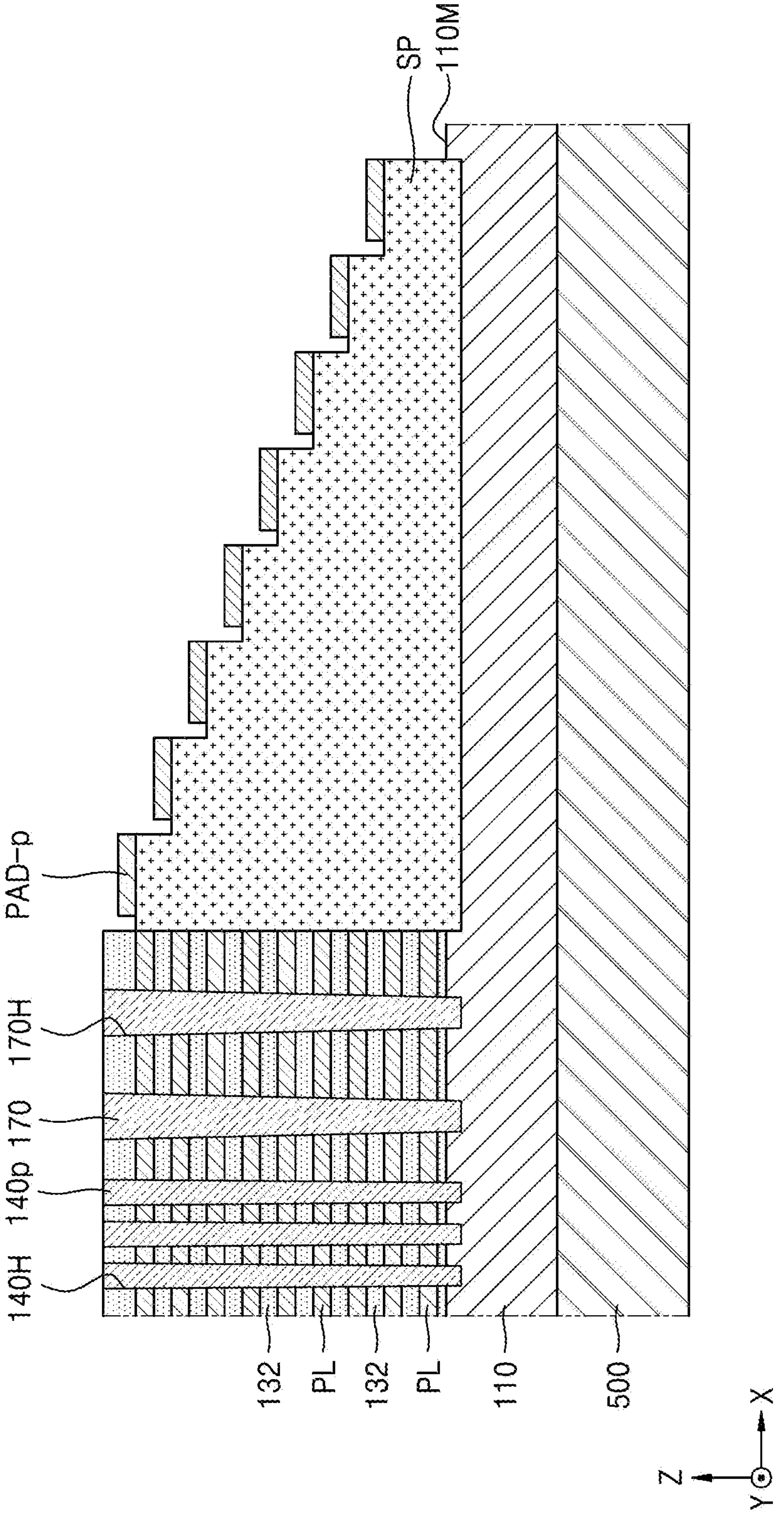
Figure 9D:
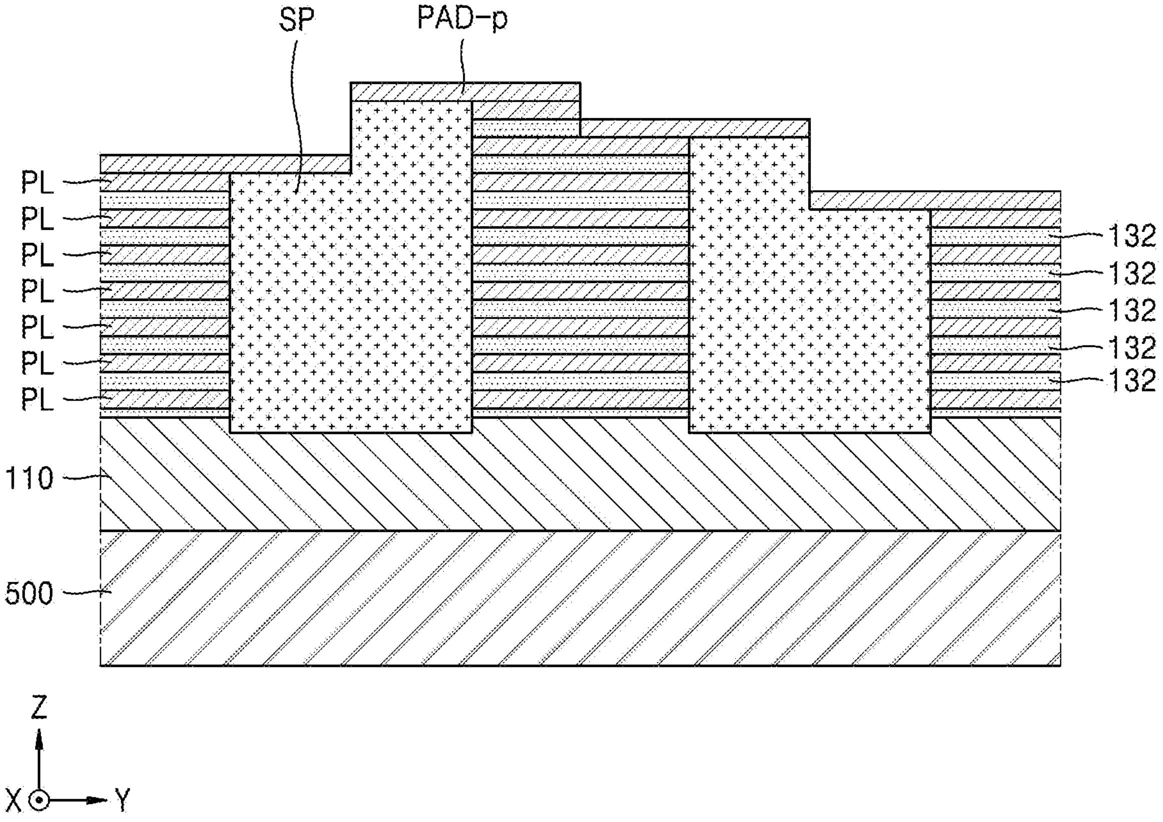

Referring to FIGS. 5, 8D, and 9D, a preliminary pad part PAD-p, which is in direct contact with the top surface of the support SP and one of the sacrificial films PL, may be formed. The bottom surface of the preliminary pad part PAD-p may be in direct contact with the top surface of the support SP and one of the sacrificial films PL. For example, in an embodiment the preliminary pad part PAD-p may include the same material as the sacrificial films PL. For example, the preliminary pad part PAD-p may include nitride.

Figure 8E:
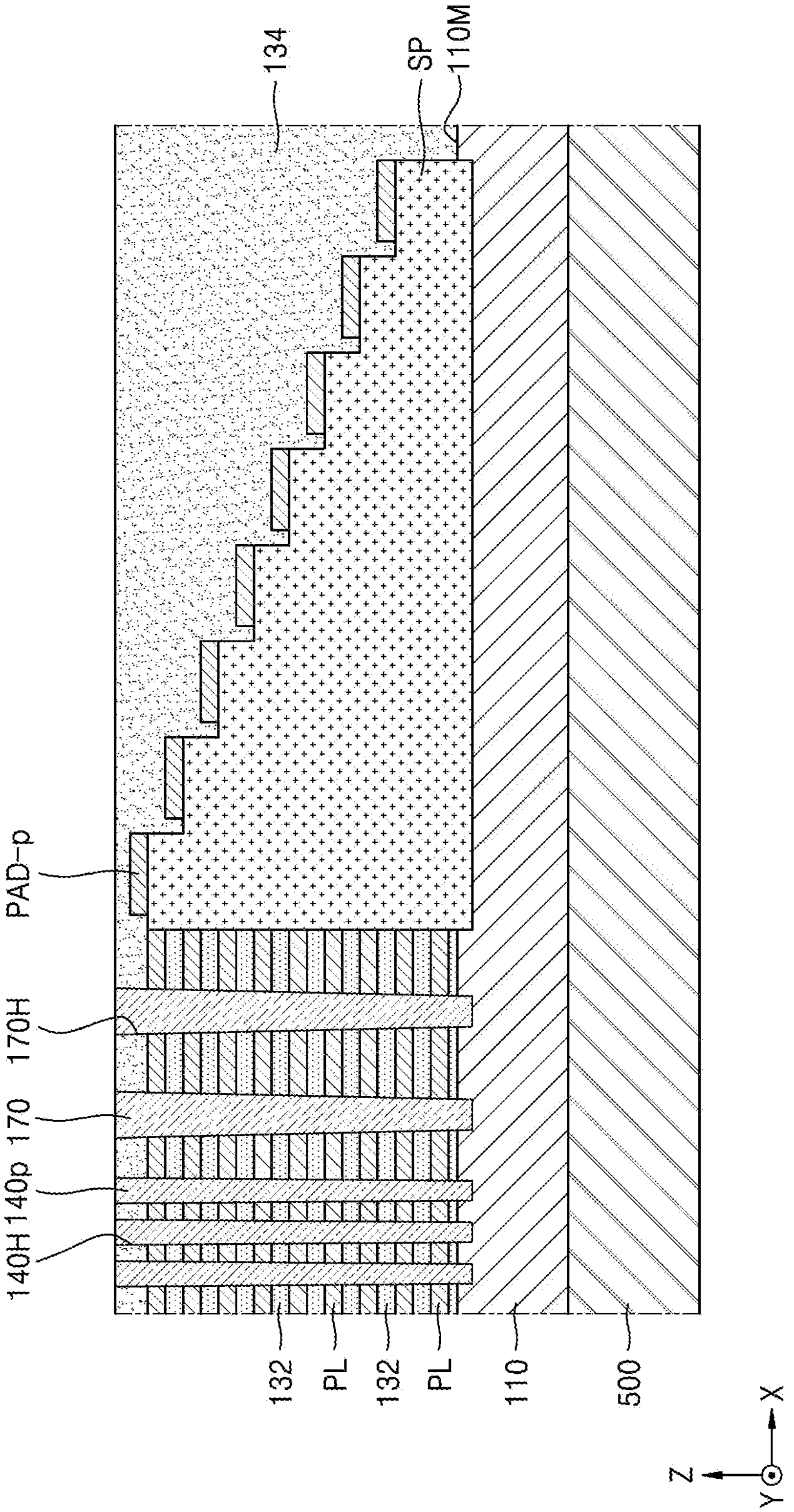
Figure 9E:
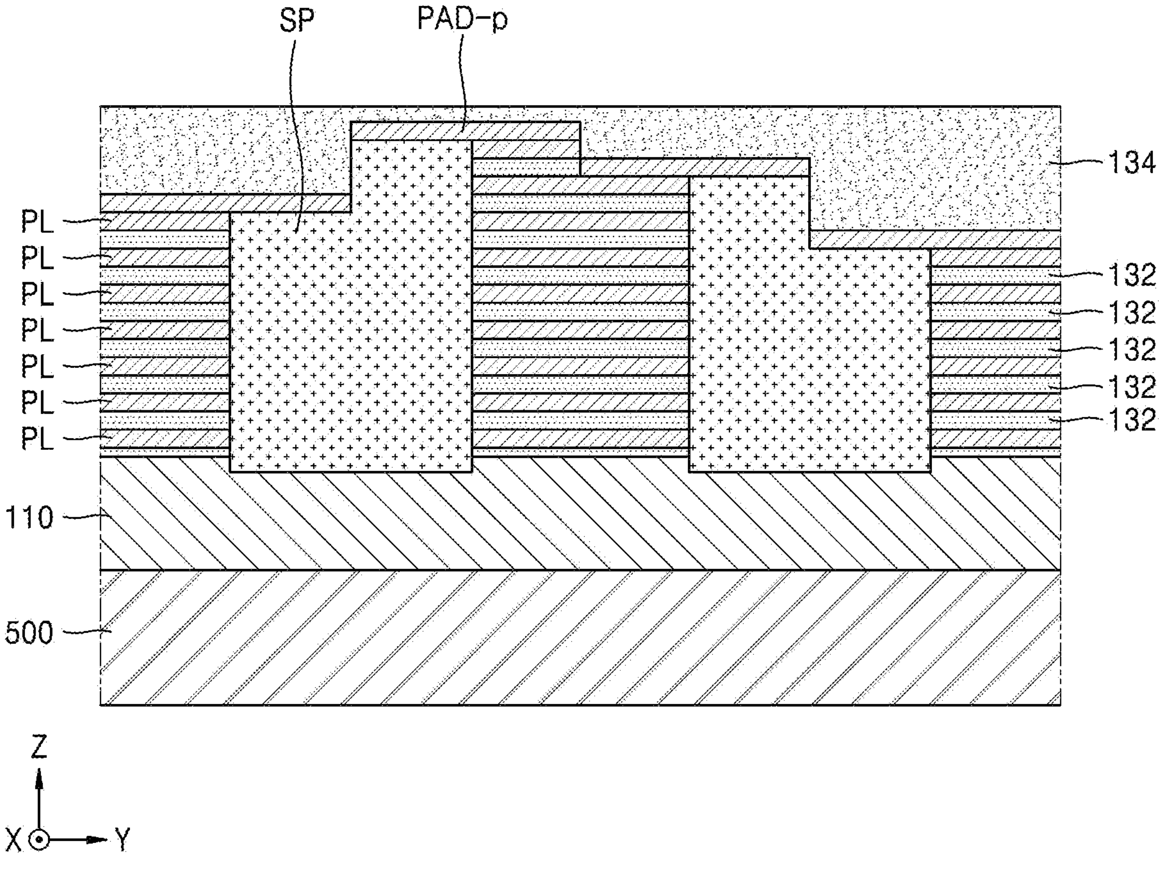

Referring to FIGS. 5, 8E, and 9E, the cover insulating layer 134 covering the insulating layers 132, the sacrificial films PL, and the support SP may be formed above the substrate 110.

Figure 8F:
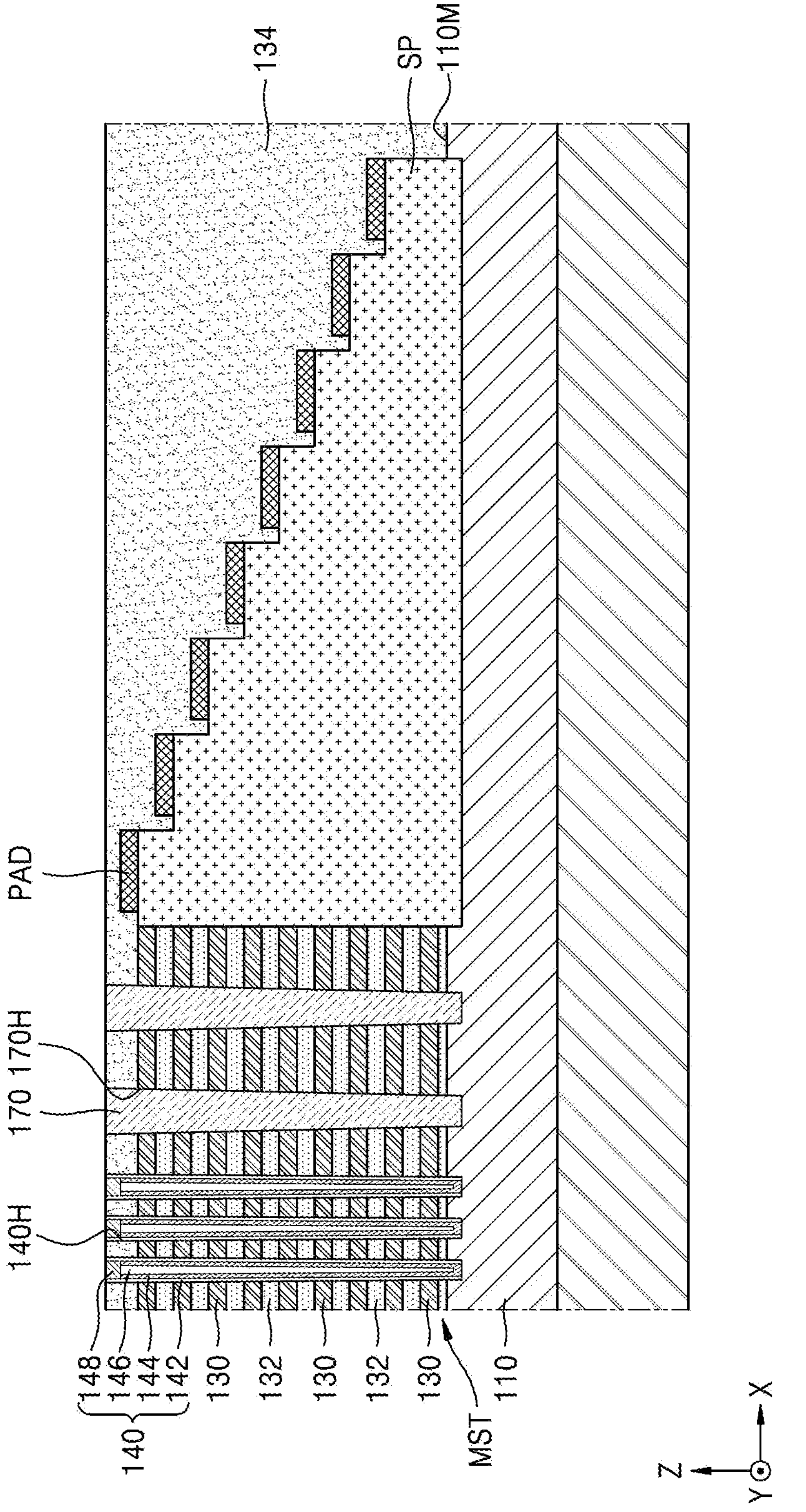
Figure 9F:
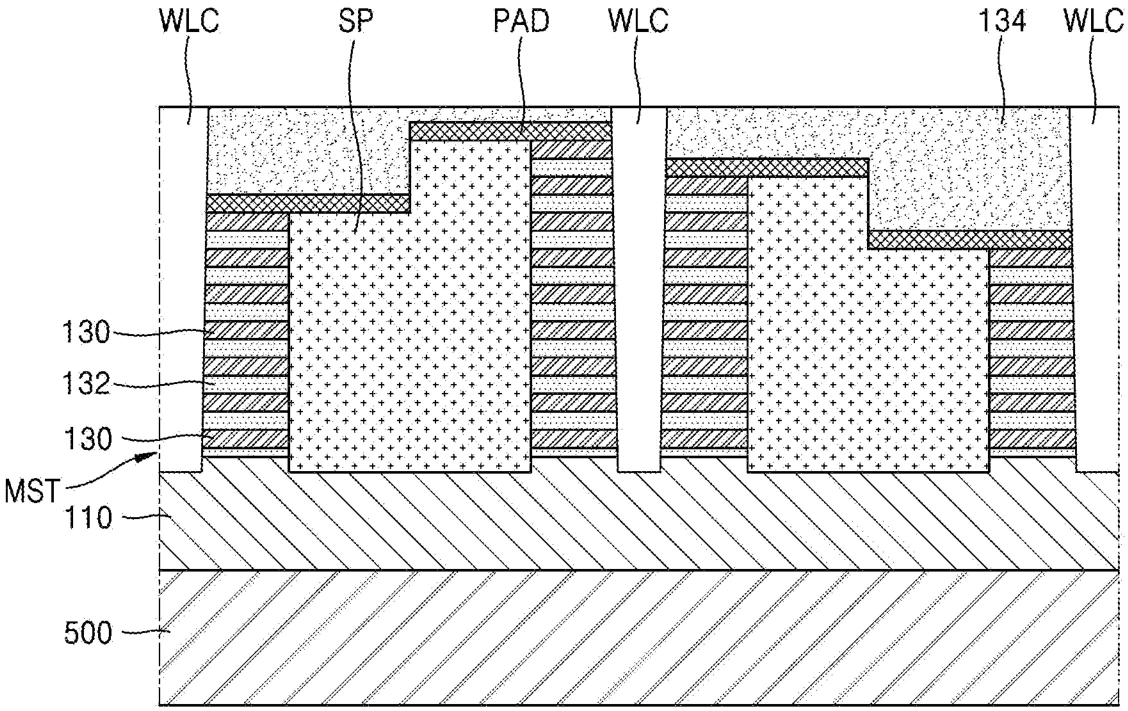

Referring to FIGS. 5, 8F, and 9F, a plurality of word line cut regions WLC, which pass through the insulating layers 132 and the sacrificial films PL and respectively expose portions of the substrate 110, may be formed The preliminary channel insulating film 140*p* may be respectively removed from the channel holes 140H, and a plurality of channel structures 140 may be formed. Each of the channel structures 140 may include the gate insulating layer 142, the channel layer 144, the buried insulating layer 146, and the conductive plug 148. The gate insulating layer 142 and the channel layer 144 may be sequentially formed on the side wall of each of the channel holes 140H. For example, the gate insulating layer 142 may be formed to be conformal to the side wall of each channel hole 140H, and the channel layer 144 may be formed to be conformal to the side wall and the bottom of the channel hole 140H. The buried insulating layer 146 may be formed on the channel layer 144 to fill the remaining space of the channel hole 140H. The conductive plug 148 may be formed on the upper portion of the channel hole 140H to be in direct contact with the channel layer 144 and block the channel hole 140H. However, embodiments of the present inventive concept are not necessarily limited thereto. For example, in some embodiments, the buried insulating layer 146 may be omitted, and the channel layer 144 may be formed to have a pillar shape filling the remaining portion of the channel hole 140H.

In some embodiments, to replace the sacrificial films PL with a plurality of word lines 130, spaces among the insulating layers 132 may be formed by selectively removing the sacrificial films PL exposed by the word line cut regions WLC, and the word lines 130 may be formed by filling the spaces with a conductive material. Similarly, to replace the preliminary pad part PAD-p with the pad part PAD, a space may be formed by selectively removing the preliminary pad part PAD-p, and the pad part PAD may then be formed by filling the space with a conductive material. In an embodiment, the word lines 130 may include a metal material, such as tungsten, tantalum, cobalt, and/or nickel.

In some embodiments, when the sacrificial films PL include polysilicon, silicidation may be performed on the sacrificial films PL to replace the sacrificial films PL with the word lines 130. In an embodiment, the word lines 130 may include tungsten silicide, tantalum silicide, cobalt silicide, or nickel silicide.

Thereafter, in an embodiment an insulating spacer and a common source line may be formed in each of the word line cut regions WLC, thereby forming a word line cut structure. In an embodiment, the insulating spacer may include silicon oxide, silicon nitride, SiON, SiOCN, SiCN, or a combination thereof. The common source line may include a metal, such as tungsten, copper, or aluminum, a conductive metal nitride, such as titanium nitride or tantalum nitride, a transition metal, such as titanium or tantalum or a combination thereof. In some embodiments, a metal silicide film may be disposed between a common source plate and the common source line to reduce the contact resistance therebetween. In an embodiment, the metal silicide film may include cobalt silicide. However, embodiments of the present inventive concept are not necessarily limited thereto. In some embodiments, when the common source line is buried in the substrate 110, the word line cut regions WLC may be filled with only an insulator, and the process of forming the common source line described above may be omitted.

When the sacrificial films PL are replaced with the word lines 130, the memory stack MST in the connection region CON may be formed.

Figure 8G:
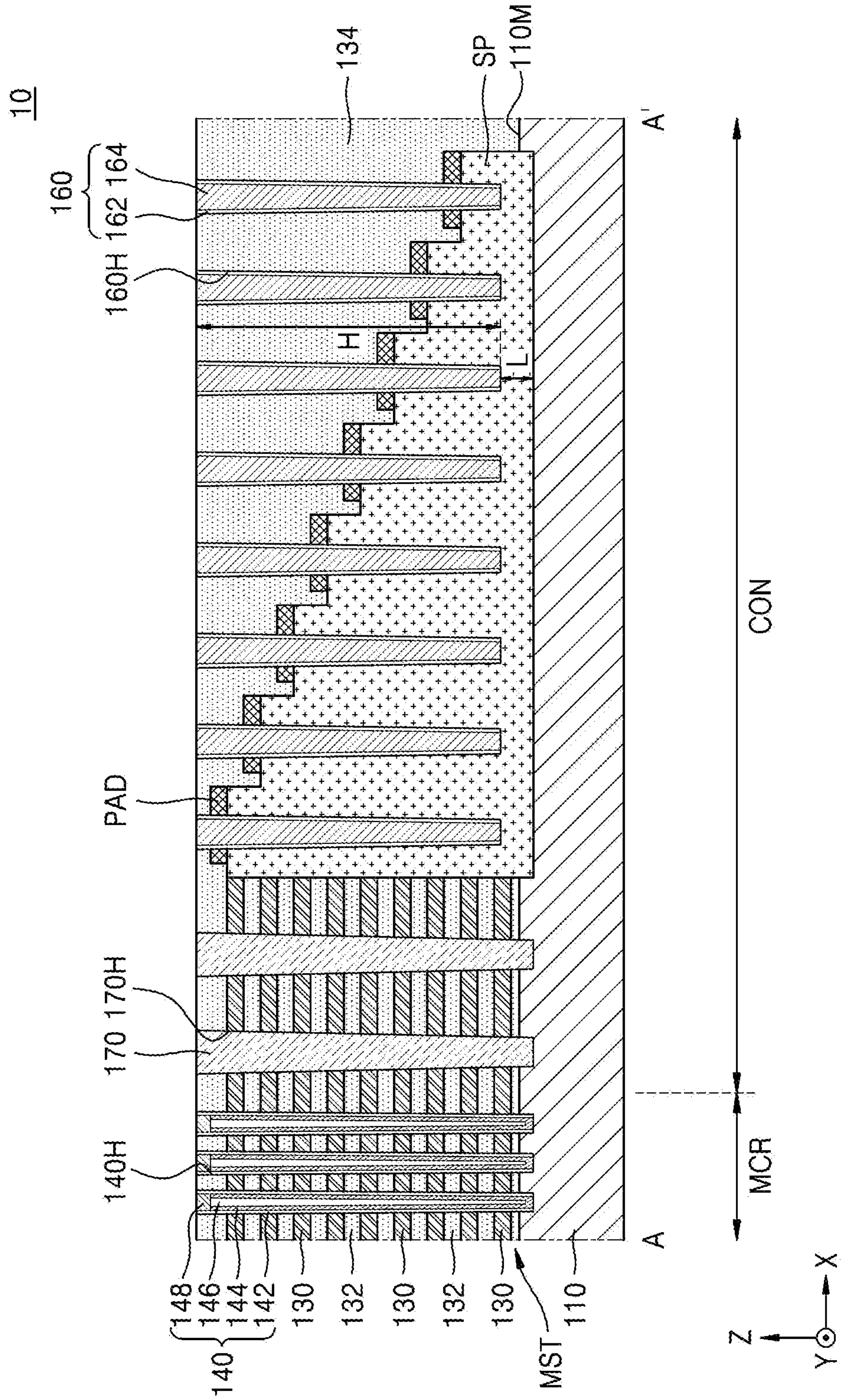
Figure 9G:
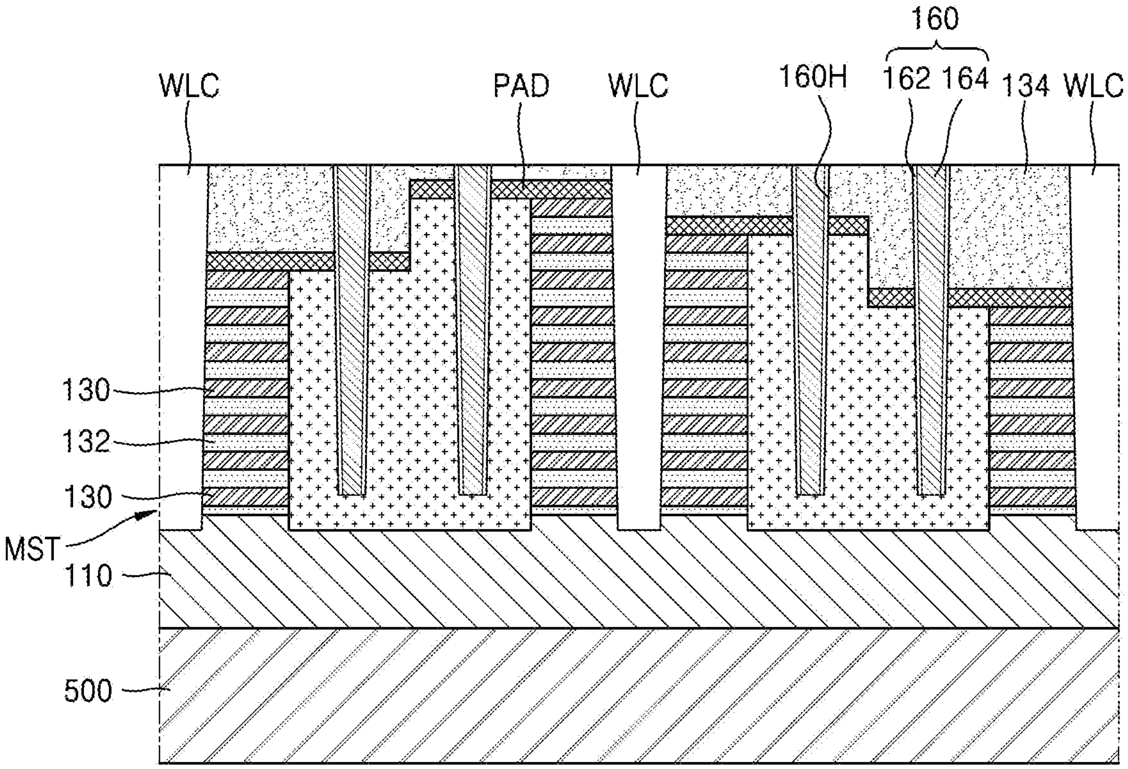

Referring to FIGS. 5, 8G, and 9G, in an embodiment a plurality of contact holes 160H passing through the pad part PAD may be formed in the connection region CON by anisotropically etching the word lines 130, the insulating layers 132, the cover insulating layer 134, and the support SP in the connection region CON by using a mask pattern as an etch mask. A plurality of contact plugs 160 may be formed by filling the contact holes 160H with a conductive material.

Each of the contact plugs 160 may include the contact plug insulating layer 162 and the contact plug conductive layer 164. The contact plug insulating layer 162 and the contact plug conductive layer 164 may be sequentially formed on the side wall of each of the contact holes 160H. For example, the contact plug insulating layer 162 may be formed to be conformal to the side wall of each contact hole 160H, and the contact plug conductive layer 164 may be formed to be conformal to the side wall and the bottom of the contact hole 160H.

In an embodiment, wiring may be additionally formed.

FIG. 10 is a cross-sectional view of a semiconductor device according to an embodiment. FIG. 11 is an enlarged cross-sectional view of a region XI in FIG. 10, according to an embodiment.

Referring to FIGS. 10 and 11, a semiconductor device 400 may have a chip-to-chip (C2C) structure. The C2C structure may refer to a structure formed by manufacturing an upper chip including a cell region CELL on a first wafer, manufacturing a lower chip including a peripheral circuit region PERI on a second wafer, different from the first wafer, and then connecting the upper chip to the lower chip in a bonding manner. For example, the bonding manner may include a method of electrically connecting a bonding metal formed on an uppermost metal layer of the upper chip to a bonding metal formed on an uppermost metal layer of the lower chip. For example, in an embodiment in which the bonding metal includes copper (Cu), the bonding manner may be Cu—Cu bonding, and the bonding metal may also include aluminum or tungsten.

Each of the peripheral circuit region PERI and the cell region CELL of the semiconductor device 400 may include an external pad bonding area PA, a word line bonding area WLBA, and a bit line bonding area BLBA.

In an embodiment, the peripheral circuit region PERI may include a first substrate 210, an interlayer insulating layer 215, a plurality of circuit elements 220*a*, 220*b*, and 220*c* formed on the first substrate 210, first metal layers 230*a*, 230*b*, and 230*c* respectively connected to the plurality of circuit elements 220*a*, 220*b*, and 220*c*, and second metal layers 240*a*, 240*b*, and 240*c* formed on the first metal layers 230*a*, 230*b*, and 230*c*. In an embodiment, the first metal layers 230*a*, 230*b*, and 230*c* may include tungsten having relatively high electrical resistivity, and the second metal layers 240*a*, 240*b*, and 240*c* may include copper having relatively low electrical resistivity.

Although the first metal layers 230*a*, 230*b*, and 230*c* and the second metal layers 240*a*, 240*b*, and 240*c* are shown and described in an embodiment illustrated in FIGS. 10 and 11, embodiments of the present inventive concept are not necessarily limited thereto. For example, in an embodiment, one or more metal layers may be further formed on the second metal layers 240*a*, 240*b*, and 240*c*. At least a portion of the one or more metal layers formed on the second metal layers 240*a*, 240*b*, and 240*c* may include aluminum or the like, which has a lower electrical resistivity than copper included in the second metal layers 240*a*, 240*b*, and 240*c*.

The interlayer insulating layer 215 may be disposed on (e.g., disposed directly thereon) the first substrate 210 and may cover the plurality of circuit elements 220*a*, 220*b*, and 220*c*, the first metal layers 230*a*, 230*b*, and 230*c*, and the second metal layers 240*a*, 240*b*, and 240*c*. In an embodiment, the interlayer insulating layer 215 may include an insulating material, such as silicon oxide, silicon nitride, or the like.

Lower bonding metals 271*b* and 272*b* may be formed on the second metal layer 240*b* in the word line bonding area WLBA. In the word line bonding area WLBA, the lower bonding metals 271*b* and 272*b* in the peripheral circuit region PERI may be electrically connected to upper bonding metals 371*b* and 372*b* in the cell region CELL in a bonding manner, and the lower bonding metals 271*b* and 272*b* and the upper bonding metals 371*b* and 372*b* may include aluminum, copper, tungsten, or the like.

The cell region CELL may include at least one memory block. The cell region CELL may include a second substrate 310 and a common source line 320. On the second substrate 310, a plurality of word lines 330, such as word lines 331 to 338, may be stacked in a direction (e.g., a Z-axis direction), perpendicular to the top surface of the second substrate 310. At least one string select line and at least one ground select line may be respectively arranged on and below the word lines 330, and the word lines 330 may be positioned between the string select line and the ground select line.

In the bit line bonding area BLBA, a channel structure CHS may extend in a vertical direction perpendicular to the top surface of the second substrate 310, and pass through the word lines 330, the string select line, and the ground select line. The channel structure CHS may include a data storage layer, a channel layer, a buried insulating layer, and the like, and the channel layer may be electrically connected to a first metal layer 350*c* and a second metal layer 360*c*. For example, the first metal layer 350*c* may be a bit line contact, and the second metal layer 360*c* may be a bit line In an embodiment, the second metal layer 360*c* (hereinafter, referred to as the bit line 360*c*) may extend in a first direction (a Y-axis direction), parallel to the top surface of the second substrate 310.

In an embodiment illustrated in FIG. 10, an area in which the channel structure CHS, the bit line 360*c*, and the like are arranged may be defined as the bit line bonding area BLBA. In the bit line bonding area BLBA, the bit line 360*c* may be electrically connected to the circuit elements 220*c* providing a page buffer 393 in the peripheral circuit region PERI. For example, the bit line 360*c* may be connected to upper bonding metals 371*c* and 372*c* in the cell region CELL, and the upper bonding metals 371*c* and 372*c* may be connected to lower bonding metals 271*c* and 272*c* connected to the circuit elements 220*c* of the page buffer 393.

In the word line bonding area WLBA, the word lines 330 may extend in the first horizontal direction (the X direction), parallel to the top surface of the second substrate 310, and may be connected to a plurality of contact plugs 340, such as contact plugs 341 to 348. The word lines 330 and the contact plugs 340 may be connected to each other by pads provided in at least a portion of the word lines 330 extending in different lengths in the first horizontal direction (the X direction). A metal contact layer 350*b* and a metal wiring layer 360*b* may be sequentially connected to a lower portion of each of the contact plugs 340 connected to the word lines 330. The contact plugs 340 may be connected to the peripheral circuit region PERI by the upper bonding metals 371*b* and 372*b* of the cell region CELL and the lower bonding metals 271*b* and 272*b* of the peripheral circuit region PERI in the word line bonding area WLBA.

The support SP may be disposed at one side of the word lines 330 in the word line bonding area WLBA (e.g., in a horizontal direction). The support SP may have a stepped structure. For example, the bottom surface of the support SP may increasingly recede from the top surface of the first substrate 210 in the vertical direction (the Z direction) as a distance increases from the bit line bonding area BLBA in the first horizontal direction (the X direction). For example, the vertical level of the bottom surface of the support SP may increase as a distance increases from the bit line bonding area BLBA in the first horizontal direction (the X direction). In an embodiment, the top surface of the support SP may be at a higher vertical level than the bottom surface of the second substrate 310. The pad part PAD may be formed on the bottom surface of the support SP. For example, the support SP may include an insulating material. For example, in an embodiment the support SP may include silicon oxide.

In FIGS. 10 and 11, the bottom surface of the contact plugs 340 may be relatively near the first substrate 210 in the vertical direction (the Z direction), and the top surface of the contact plugs 340 may face the bottom surface thereof.

The top surface of the contact plugs 340 may be at a lower vertical level than the top surface of the support SP and may be at a higher vertical level than the top surface of an uppermost pad part PAD of the plurality of pad parts PAD. The vertical level of the top surface of each of the contact plugs 340 may be higher than a top surface of an uppermost word line 331 of the plurality of word lines 330.

A pad part PAD may be disposed on the bottom surface of the support SP having a stepped shape and may refer to each of pads, which are respectively connected to the word lines 330 electrically and/or physically. The pad part PAD may be in direct contact with each of the word lines 330. In addition, the pad part PAD may be separated from an insulating layer which is on the word lines 330 contacting the pad part PAD, in the first, second, or third horizontal direction (the X, Y, or diagonal direction). A cover insulating layer may be disposed on the pad part PAD.

FIG. 11 illustrates an enlarged view of a lowermost pad part l-PAD among the plurality of pad parts PAD. The top surface of the lowermost pad part l-PAD may be in direct contact with the lowermost word line 338 and the support SP. The top and bottom surfaces of a pad part PAD including the lowermost pad part l-PAD may have a stepped portion. For example, the top surface of a pad part PAD directly contacting the word lines 330 may be positioned further away in the vertical direction (the Z direction) from a top surface 210M of the first substrate 210 than the top surface of a pad part PAD directly contacting the support SP. Thus, the top surface of the pad part PAD directly contacting the word lines 330 may be positioned at a higher vertical level than the top surface of the pad part PAD directly contacting the support SP.

The top surface of the lowermost pad part l-PAD contacting the support SP may be referred to as a third portion PAD-3, and the top surface of the lowermost pad part l-PAD contacting the lowermost word line 338 may be referred to as a fourth portion PAD-4. For example, the third portion PAD-3 of the lowermost pad part l-PAD may be closer to the top surface 210M of the first substrate 210 than the fourth portion PAD-4 of the pad part PAD in the vertical direction (the Z direction). The third portion PAD-3 of the lowermost pad part l-PAD may be at a lower vertical level than the fourth portion PAD-4 of the pad part PAD.

The bottom surface of the support SP directly contacting the top surface of the pad part PAD may be positioned at a lower vertical level than the bottom surface of the word lines 330 directly contacting the top surface of the pad part PAD. In an embodiment in which the bottom surface of the support SP directly contacting the top surface of the pad part PAD is positioned at a lower vertical level than the bottom surface of the word lines 330 directly contacting the top surface of the pad part PAD, the pad part PAD may be in directly contact with only one word line 330, and accordingly, the semiconductor device 400 may have increased electrical reliability.

The deviation percentage in heights H of contact plugs 340 may be less than about 50%. The deviation percentage in distances L from the top surface of the support SP to the top surfaces of the contact plugs 340 in the vertical direction (the Z direction) may be less than about 50%. For example, in an embodiment the deviation percentage in heights H of the contact plugs 340 may be in a range from about 30% to about 50%.

The contact plugs 340 may be electrically connected to the circuit elements 220*b* forming a row decoder 394 in the peripheral circuit region PERI. In an embodiment, operating voltages of the circuit elements 220*b* forming the row decoder 394 may be different than operating voltages of the circuit elements 220*c* forming the page buffer 393. For example, in an embodiment operating voltages of the circuit elements 220*c* forming the page buffer 393 may be greater than operating voltages of the circuit elements 220*b* forming the row decoder 394.

A common source line contact plug 380 may be disposed in the external pad bonding area PA. In an embodiment, the common source line contact plug 380 may include a conductive material, such as a metal, a metal compound, polysilicon, or the like, and may be electrically connected to the common source line 320. A metal contact layer 350*a* and a metal wiring layer 360*a* may be sequentially stacked on a lower portion of the common source line contact plug 380. For example, an area in which the common source line contact plug 380, the metal contact layer 350*a*, and the metal wiring layer 360*a* are arranged, may be defined as the external pad bonding area PA.

First and second I/O pads 205 and 305 may be in the external pad bonding area PA. Referring to FIG. 10, a lower insulating film 201 covering the bottom surface of the first substrate 210 may be formed below the first substrate 210, and the first I/O pad 205 may be formed on the lower insulating film 201 The first I/O pad 205 may be connected to at least one of the circuit elements 220*a*, 220*b*, and 220*c* in the peripheral circuit region PERI through a first I/O contact plug 203 and may be separated from the first substrate 210 by the lower insulating film 201. In addition, a side insulating film may be disposed between the first I/O contact plug 203 and the first substrate 210 to electrically separate the first I/O contact plug 203 from the first substrate 210.

Referring to FIG. 10, an upper insulating film 301 covering the top surface of the second substrate 310 may be formed on the second substrate 310, and the second I/O pad 305 may be on the upper insulating film 301. The second I/O pad 305 may be connected to at least one of the circuit elements 220*a*, 220*b*, and 220*c* in the peripheral circuit region PERI through a second I/O contact plug 303. In an embodiment, the second I/O pad 305 may be electrically connected to the circuit element 220*a*.

According to an embodiment, the second substrate 310 and the common source line 320 may not be arranged in an area in which the second I/O contact plug 303 is arranged. Also, the second I/O pad 305 may not overlap the word lines 330 in a third direction (a Z-axis direction). Referring to FIG. 10, the second I/O contact plug 303 may be separated from the second substrate 310 in a direction parallel to the top surface of the second substrate 310, and may pass through the interlayer insulating layer 315 of the cell region CELL to be connected to the second I/O pad 305.

According to an embodiment, the first I/O pad 205 and the second I/O pad 305 may be selectively formed. For example, the semiconductor device 400 may include only the first I/O pad 205 below the first substrate 210 or the second I/O pad 305 above the second substrate 310. Alternatively, in an embodiment the semiconductor device 400 may include both the first I/O pad 205 and the second I/O pad 305.

A metal pattern in an uppermost metal layer may be provided as a dummy pattern or the uppermost metal layer may not be present in each of the external pad bonding area PA and the bit line bonding area BLBA, respectively included in the cell region CELL and the peripheral circuit region PERI.

In the external pad bonding area PA, the semiconductor device 400 may include a lower metal pattern 273*a* in an uppermost metal layer of the peripheral circuit region PERI in correspondence to an upper metal pattern 372*a* formed in a lowermost metal layer of the cell region CELL. In an embodiment, the lower metal pattern 273*a* of the peripheral circuit region PERI has the same shape as the upper metal pattern 372*a* of the cell region CELL. In the peripheral circuit region PERI, the lower metal pattern 273*a* formed in the uppermost metal layer of the peripheral circuit region PERI may not be connected to a contact. Similarly, in the external pad bonding area PA, the upper metal pattern 372*a*, which has the same shape as the lower metal pattern 273*a* formed in an uppermost metal layer of the peripheral circuit region PERI, may be formed in a lowermost metal layer of the cell region CELL in correspondence to the lower metal pattern 273*a* of the peripheral circuit region PERI.

The lower bonding metals 271*b* and 272*b* may be formed on the second metal layer 240*b* in the word line bonding area WLBA In the word line bonding area WLBA, the lower bonding metals 271*b* and 272*b* of the peripheral circuit region PERI may be electrically connected to the upper bonding metals 371*b* and 372*b* of the cell region CELL by bonding.

Furthermore, in the bit line bonding area BLBA, an upper metal pattern 392, which has the same shape as a lower metal pattern 252 formed in the uppermost metal layer of the peripheral circuit region PERI, may be formed in a lowermost metal layer of the cell region CELL in correspondence to the lower metal pattern 252 the peripheral circuit region PERI. A contact may not be formed on the upper metal pattern 392 formed in the uppermost metal layer of the cell region CELL.

Figure 12:
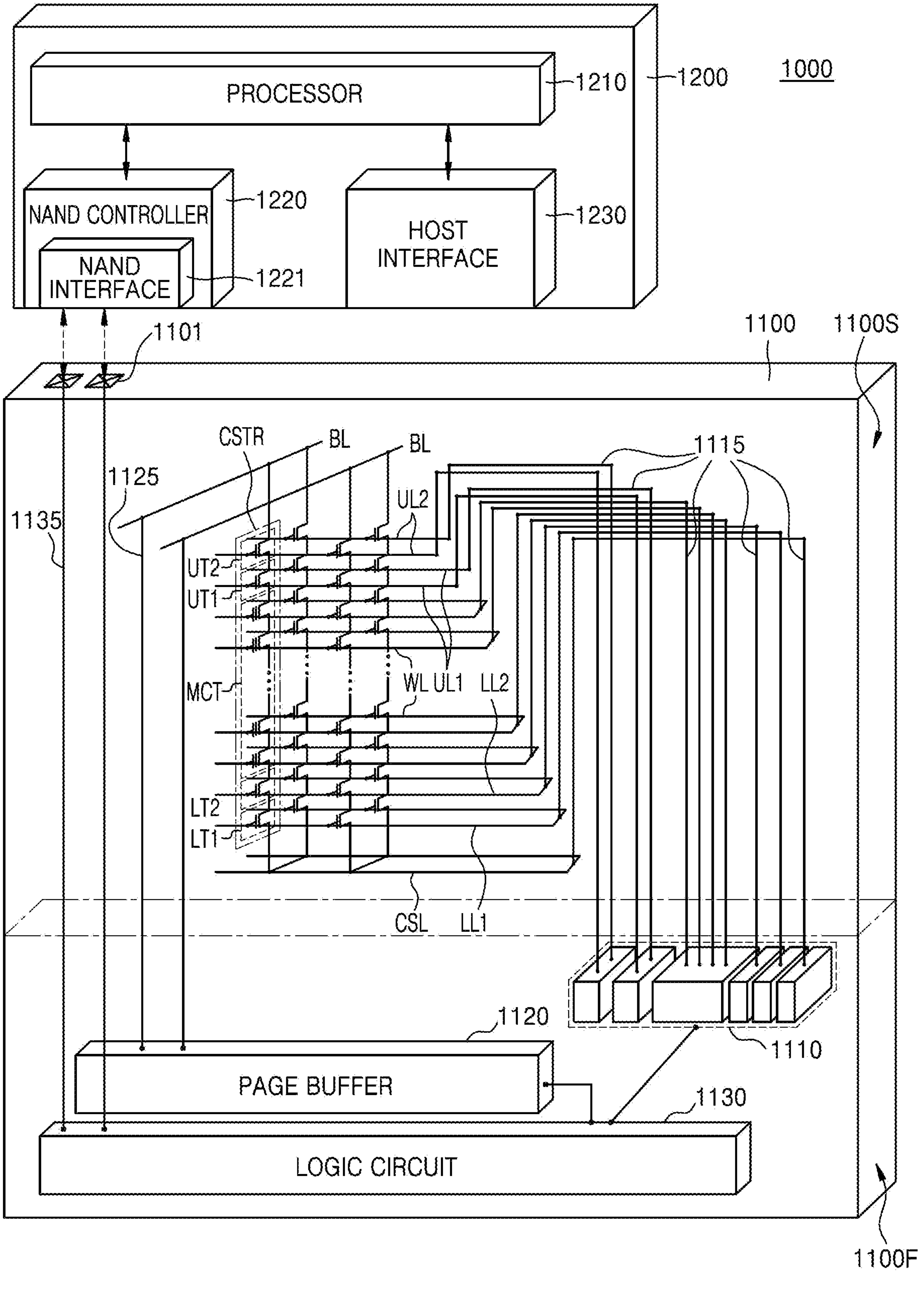
FIG. 12 is a schematic diagram of an electronic system including a semiconductor device, according to an embodiment of the present inventive concept.

FIG. 12 is a schematic diagram of an electronic system including a semiconductor device, according to an embodiment.

Referring to FIG. 12, an electronic system 1000 may include at least one semiconductor device 1100 and a memory controller 1200 electrically connected to the semiconductor device 1100. For example, in an embodiment the electronic system 1000 may correspond to any one of a solid state drive (SSD) device, a universal serial bus (USB) device, a computing system, a medical device, and a communication device, each of which includes at least one semiconductor device 1100.

The semiconductor device 1100 may include a non-volatile semiconductor device. For example, the semiconductor device 1100 may be a NAND flash semiconductor device including one of the semiconductor devices 10, 10*a*, and 400 described with reference to FIGS. 1 to 11. The semiconductor device 1100 may include a first structure 1100F and a second structure 1100S on the first structure 1100F. The first structure 1100F may correspond to a peripheral circuit structure, which includes a row decoder 1110, a page buffer 1120, and a logic circuit 1130.

The second structure 1100S may correspond to a memory cell structure, which includes a bit line BL, a common source line CSL, a plurality of word lines WL, first and second string select lines UL1 and UL2, first and second ground select lines LL1 and LL2, and a plurality of memory cell strings CSTR between the bit line BL and the common source line CSL.

In the second structure 1100S, each of the memory cell strings CSTR may include ground select transistors LT1 and LT2 near the common source line CSL, string select transistors UT1 and UT2 near the bit line BL, and a plurality of memory cell transistors MCT positioned between the ground select transistors LT1 and LT2 and the string select transistors UT1 and UT2. The number of ground select transistors LT1 and LT2 and the number of string select transistors UT1 and UT2 may vary with embodiments.

In an embodiment, the first and second ground select lines LL1 and LL2 may be respectively connected to the respective word lines of the ground select transistors LT1 and LT2. The word lines WL may be respectively connected to the respective word lines of the memory cell transistors MCT. The first and second string select lines UL1 and UL2 may be respectively connected to the respective word lines of the string select transistors UT1 and UT2.

The common source line CSL, the first and second ground select lines LL1 and LL2, the word lines WL, and the first and second string select lines UL1 and UL2 may be electrically connected to the row decoder 1110 through a plurality of first connecting wires 1115, which extend to the second structure 1100S in the first structure 1100F. A plurality of bit lines BL may be electrically connected to the page buffer 1120 through a plurality of second connecting wirings 1125, which extend to the second structure 1100S in the first structure 1100F.

The semiconductor device 1100 may communicate with the memory controller 1200 through an I/O pad 1101, which is electrically connected to the logic circuit 1130. The I/O pad 1101 may be electrically connected to the logic circuit

1130 through an VO connection wiring 1135, which extends to the second structure 1100S in the first structure 1100F.

The memory controller 1200 may include a processor 1210, a NAND controller 1220, and a host interface 1230. In some embodiments, the electronic system 1000 may include a plurality of semiconductor devices 1100. In this embodiment, the memory controller 1200 may control the plurality of semiconductor devices 1100.

The processor 1210 may generally control the operations of the electronic system 1000 including the memory controller 1200. The processor 1210 may operate according to certain firmware and may control the NAND controller 1220 to access the semiconductor device 1100. The NAND controller 1220 may include a NAND interface 1221 communicating with the semiconductor device 1100. In an embodiment, a control command for controlling the semiconductor device 1100, data to be written to the memory cell transistors MCT of the semiconductor device 1100, data read from the memory cell transistors MCT of the semiconductor device 1100, and/or the like may be transmitted through the NAND interface 1221. The host interface 1230 may provide a function for communication between the electronic system 1000 and an external host. When receiving a control command from an external host through the host interface 1230, the processor 1210 may control the semiconductor device 1100 in response to the control command.

Figure 13:
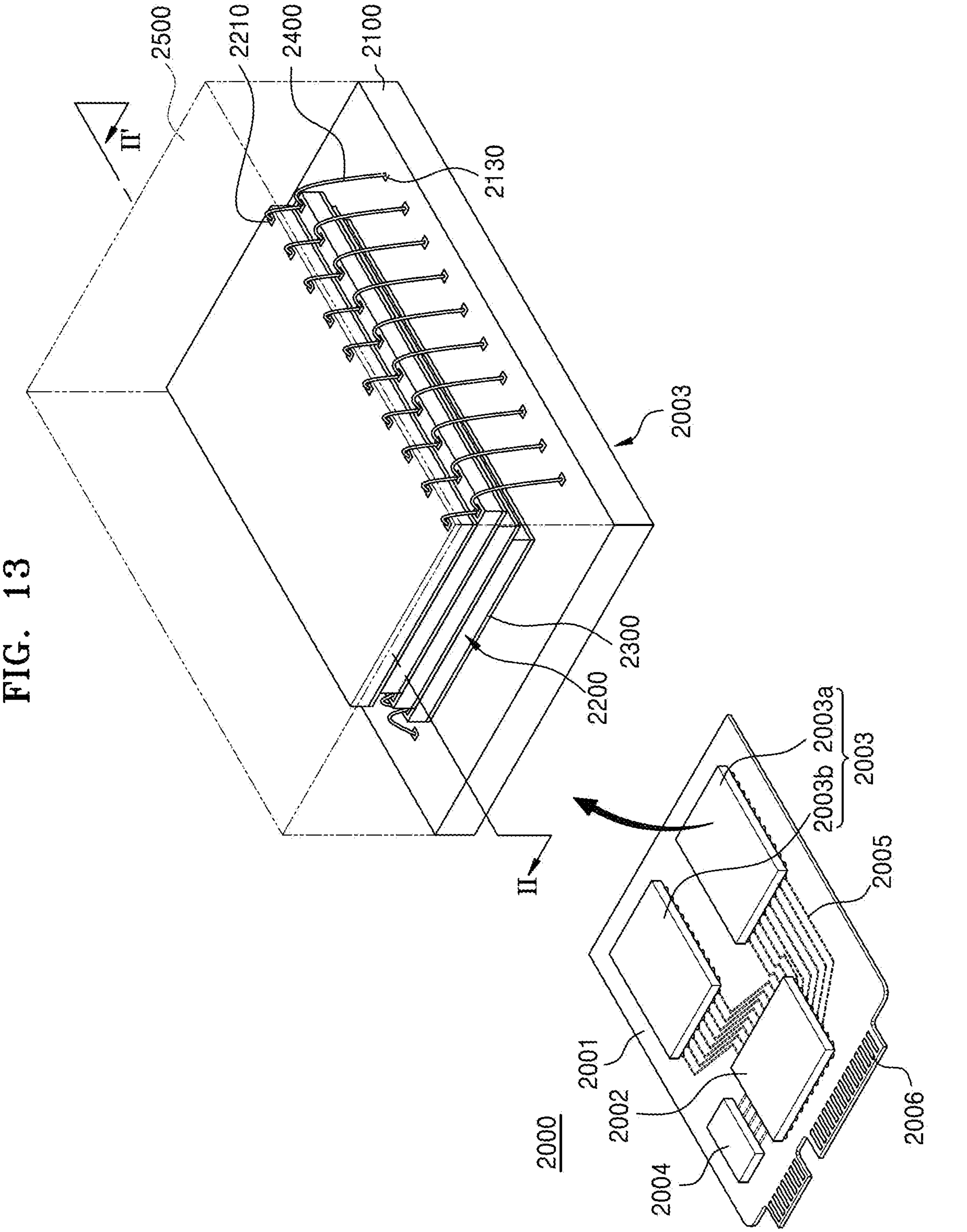
FIG. 13 is a schematic perspective view of an electronic system including a semiconductor device according to an embodiment of the present inventive concept.

FIG. 13 is a schematic perspective view of an electronic system including a semiconductor device, according to an embodiment.

Referring to FIG. 13, an electronic system 2000 according to an embodiment may include a main board 2001, a memory controller 2002 mounted on the main board 2001, at least one semiconductor package 2003, and dynamic random access memory (DRAM) 2004. In an embodiment, the semiconductor package 2003 and the DRAM 2004 may be connected to the memory controller 2002 by a plurality of wiring patterns 2005 formed on the main board 2001.

The main board 2001 may include a connector 2006, which includes a plurality of pins coupled to an external host. The number and placement of pins in the connector 2006 may vary with a communication interface between the electronic system 2000 and the external host. In an embodiment, the electronic system 2000 may communicate with an external host according to any one of various different interfaces, such as USB, peripheral component interconnect express (PCI-Express), serial advanced technology attachment (SATA), and M-PHY for universal flash storage (UFS). In an embodiment, the electronic system 2000 may be driven by electric power supplied from an external host through the connector 2006. The electronic system 2000 may further include a power management integrated circuit (PMIC) which distributes electric power supplied from the external host to the memory controller 2002 and the semiconductor package 2003.

The memory controller 2002 may write data to or read data from the semiconductor package 2003 and may increase the operating speed of the electronic system 2000.

The DRAM 2004 may function as a buffer memory for mitigating the speed difference between an external host and the semiconductor package 2003 that is a data storage space. The DRAM 2004 included in the electronic system 2000 may also operate as a sort of cache memory and provide a space for temporarily storing data in a control operation on the semiconductor package 2003. In an embodiment in which the DRAM 2004 is included in the electronic system 2000, the memory controller 2002 may further include a DRAM controller for controlling the DRAM 2004 in addition to a NAND controller for controlling the semiconductor package 2003.

The semiconductor package 2003 may include first and second semiconductor packages **2003*a* and 2003*b* separated from each other (e.g., in a horizontal direction). Each of the first and second semiconductor packages 2003*a* and 2003*b* may include a plurality of semiconductor chips 2200. In an embodiment, each of the first and second semiconductor packages 2003*a* and 2003*b* may include a package substrate 2100, the semiconductor chips 2200 on the package substrate 2100, an adhesive layer 2300 on the bottom surface of each of the semiconductor chips 2200, a connection structure 2400 electrically connecting the semiconductor chips 2200 to the package substrate 2100, and a molding layer 2500 covering the semiconductor chips 2200 and the connection structure 2400 on the package substrate 2100**.

The package substrate 2100 may include a printed circuit board (PCB) including a plurality of package upper pads 2130. Each of the semiconductor chips 2200 may include an I/O pad 2210. The I/O pad 2210 may correspond to an I/O pad 1101 in FIG. 12. Each of the semiconductor chips 2200 may include at least one of the semiconductor devices 10, **10*a*, and 400 described with reference to FIGS. 1 to 11**.

In an embodiment, the connection structure 2400 may include a bonding wire which electrically connects the I/O pad 2210 to a package upper pad 2130. Accordingly, in the first and second semiconductor packages **2003*a* and 2003*b*, the semiconductor chips 2200 may be electrically connected to each other by a bonding wire and electrically connected to the package upper pads 2130 of the package substrate 2100. In an embodiment, in the first and second semiconductor packages 2003*a* and 2003*b*, the semiconductor chips 2200 may be electrically connected to each other by a connection structure which includes a through silicon via (TSV), instead of the connection structure 2400** using a bonding wire.

In an embodiment, the memory controller 2002 and the semiconductor chips 2200 may be included in a single package. In an embodiment, the memory controller 2002 and the semiconductor chips 2200 may be mounted on an interposer board separate from the main board 2001 and may be connected to each other by wiring formed on the interposer board.

Figure 14:
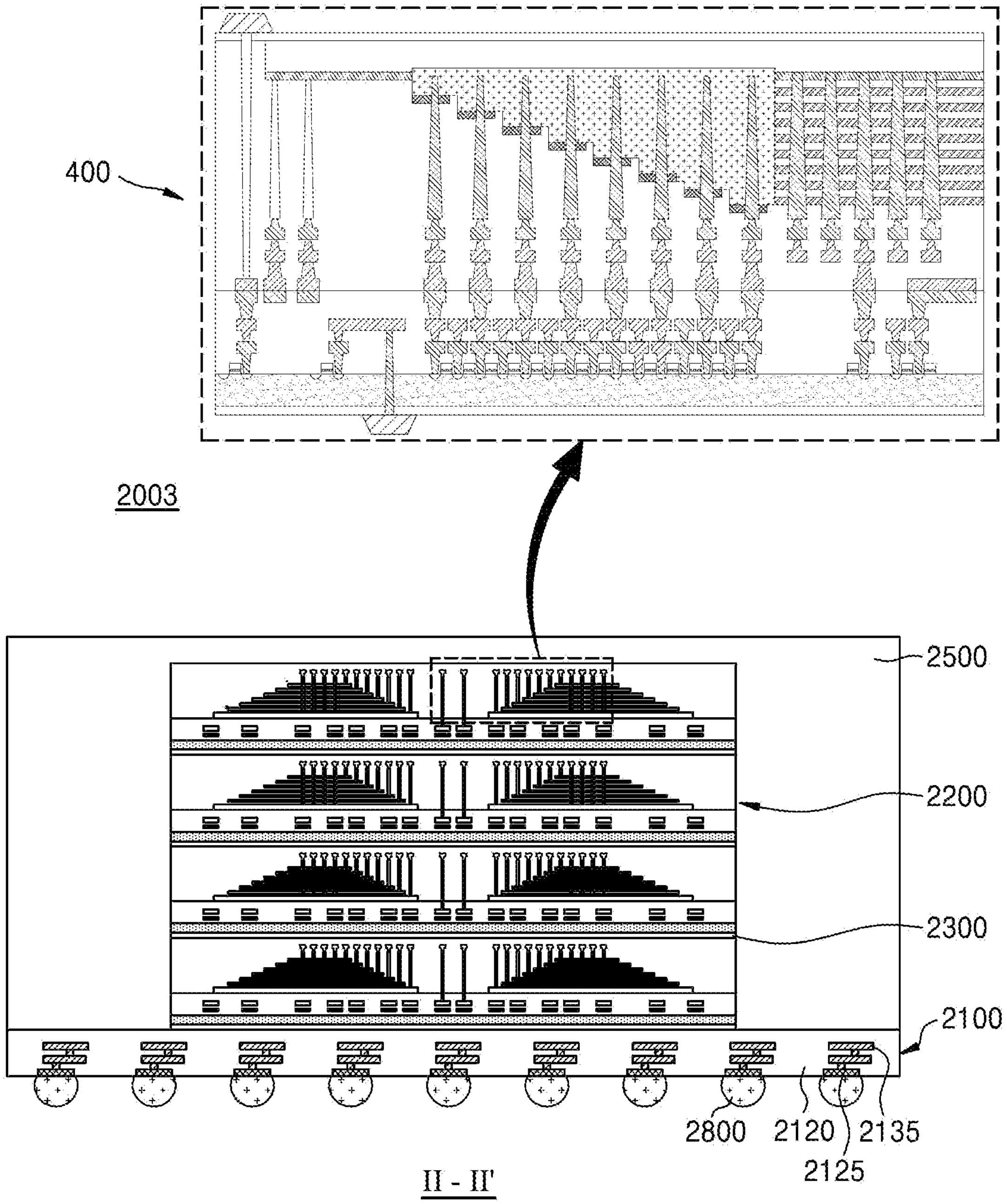
FIG. 14 is a schematic cross-sectional view of semiconductor packages according to an embodiment of the present inventive concept.

FIG. 14 is a schematic cross-sectional view of a semiconductor package according to an embodiment.

Referring to FIG. 14, in the semiconductor package 2003, the package substrate 2100 may be a PCB. The package substrate 2100 may include a package substrate body 2120, a plurality of package upper pads (2130 in FIG. 13) on the top surface of the package substrate body 2120, a plurality of lower pads 2125 arranged on or exposed by the bottom surface of the package substrate body 2120, and a plurality of internal wires 2135 which are inside the package substrate body 2120 and electrically connect the package upper pads 2130 to the lower pads 2125. As shown in FIG. 14, the package upper pads 2130 (in FIG. 13) may be electrically connected to a plurality of connection structures 2400 (in FIG. 13). As shown in FIG. 14, the lower pads 2125 may be respectively connected to the wiring patterns 2005 on the main board 2001 of the electronic system 2000 of FIG. 13 through a plurality of conductive bumps 2800. Each of the semiconductor chips 2200 may include at least one of the semiconductor devices 10, **10*a*, and 400**.

While the present inventive concept has been particularly shown and described with reference to embodiments thereof, it will be understood that various changes in form and details may be made therein without departing from the spirit and scope of the present inventive concept.

What is claimed is:

1. A semiconductor device comprising:

a semiconductor substrate including a memory cell region and a connection region;

a memory stack including a plurality of word lines extending in the memory cell region and the connection region in a horizontal direction that is parallel with an upper surface of the semiconductor substrate, the plurality of word lines overlapping with each other in a vertical direction;

a support in the connection region and positioned at a side of the memory stack, the support including a plurality of steps and passing through at least some of the plurality of word lines;

a plurality of pad parts on a top surface of the support; and a plurality of contact plugs passing through the support in the vertical direction, the plurality of contact plugs directly contacting the plurality of pad parts for electrical connection therewith.

2. The semiconductor device of claim 1, wherein each of the plurality of contact plugs passes through one of the plurality of pad parts respectively in direct contact with the plurality of contact plugs.

3. The semiconductor device of claim 1, wherein a vertical level of a bottom surface of each of the plurality of contact plugs is positioned between a bottommost surface of the support and a bottom surface of a lowermost pad part of the plurality of pad parts that is closest to the semiconductor substrate in the vertical direction.

4. The semiconductor device of claim 1, wherein each of top and bottom surfaces of a pad part disposed on the support among the plurality of pad parts includes a stepped portion.

5. The semiconductor device of claim 1, wherein:

the horizontal direction includes a first horizontal direction and a second horizontal direction that is perpendicular to the first horizontal direction; and the support surrounds a side wall of a plurality of contact plugs among the plurality of contact plugs arranged in both the first horizontal direction and the second horizontal direction.

6. The semiconductor device of claim 1, wherein:

the horizontal direction includes a first horizontal direction and a second horizontal direction that is perpendicular to the first horizontal direction; and the support surrounds respective side walls of at least two contact plugs of the plurality of contact plugs that are arranged in the first horizontal direction and surrounds a side wall of one of the plurality of contact plugs in the second horizontal direction.

7. The semiconductor device of claim 1, wherein the plurality of pad parts are in direct contact with at least one of the plurality of word lines.

8. The semiconductor device of claim 1, further comprising at least one dummy channel structure passing through the plurality of word lines in the vertical direction in the connection region.

9. A semiconductor device comprising:

a first semiconductor substrate including a memory cell region and a connection region;

a peripheral circuit region above the first semiconductor substrate;

a memory stack in the memory cell region and the connection region above the peripheral circuit region, the memory stack including a plurality of word lines extending in a horizontal direction that is parallel with an upper surface of the first semiconductor substrate and overlapping with each other in a vertical direction that is orthogonal to the horizontal direction;

a plurality of channel structures in the memory cell region, the plurality of channel structures passing through the plurality of word lines in the vertical direction;

a support in the connection region and positioned at a side of the memory stack, the support including a plurality of steps and passing through at least some of the plurality of word lines;

a plurality of pad parts on a bottom surface of the support;

a second semiconductor substrate on the memory stack; and a plurality of contact plugs passing through the support in the vertical direction, the plurality of contact plugs directly contacting the plurality of pad parts for electrical connection therewith.

10. The semiconductor device of claim 9, wherein a vertical level of a top surface of each of the plurality of contact plugs is positioned between a vertical level of a top surface of an uppermost pad part of the plurality of pad parts and a vertical level of a top surface of the support.

11. The semiconductor device of claim 9, wherein a vertical level of a top surface of each of the plurality of contact plugs is higher than a top surface of an uppermost word line of the plurality of word lines.

12. The semiconductor device of claim 9, wherein the bottom surface of the support directly contacting each of the plurality of pad parts is positioned at a lower vertical level than a bottom surface of a word line electrically connected to each of the plurality of pad parts among the plurality of word lines and includes a stepped portion.

13. The semiconductor device of claim 9, further comprising a dummy channel structure passing through the memory stack in the vertical direction in the connection region, wherein the dummy channel structure increases structural stability of the plurality of word lines.

14. The semiconductor device of claim 9, wherein a thickness of the support in the horizontal direction is greater than about twice a diameter of each of the plurality of contact plugs.

15. The semiconductor device of claim 9, wherein:

the horizontal direction includes a first horizontal direction and a second horizontal direction that is perpendicular to the first horizontal direction;

a thickness of the support in the first horizontal direction is greater than about twice a diameter of each of the plurality of contact plugs; and a thickness of the support in the second horizontal direction is greater than the diameter of each of the plurality of contact plugs and is less than about twice the diameter of each of the plurality of contact plugs.

16. The semiconductor device of claim 9, wherein a top surface of the support is position at a higher vertical level than a bottommost surface of the second semiconductor substrate.

17. The semiconductor device of claim 9, wherein:

the memory cell region includes a bit line bonding area having the plurality of channel structures arranged therein; and the connection region includes an external pad bonding area and a word line bonding area having the plurality of contact plugs arranged therein.

18. The semiconductor device of claim 9, wherein the support includes an insulator.

19. An electronic system comprising:

a main board;

a semiconductor device on the main board; and a controller on the main board and electrically connected to the semiconductor device, wherein the semiconductor device includes:

a semiconductor substrate including a memory cell region and a connection region;

a memory stack including a plurality of word lines extending in the memory cell region and the connection region in a horizontal direction that is parallel with an upper surface of the semiconductor substrate, the plurality of word lines overlapping with each other in a vertical direction;

a peripheral circuit on the memory stack;

a support in the connection region and positioned at a side of the memory stack, the support including a plurality of steps and passing through at least some of the plurality of word lines;

a plurality of pad parts on a top surface of the support;

a plurality of contact plugs passing through the support in the vertical direction, the plurality of contact plugs directly contacting the plurality of pad parts for electrical connection therewith; and an input/output pad electrically connected to the peripheral circuit.

20. The electronic system of claim 19, wherein the main board includes wiring patterns electrically connecting the semiconductor device to the controller, the semiconductor device further includes:

a plurality of channel structures in the memory cell region and passing through the plurality of word lines in the vertical direction;

a first semiconductor substrate on the peripheral circuit; and the semiconductor substrate corresponds to a second semiconductor substrate spaced apart from the first semiconductor substrate in the vertical direction.

* * * * *